(12) United States Patent
Pan et al.

(10) Patent No.: US 9,252,817 B2
(45) Date of Patent: Feb. 2, 2016

(54) DYNAMIC LOG-LIKELIHOOD RATIO MAPPING FOR ERROR CORRECTING CODE DECODING

(71) Applicant: Fusion-io, Inc., Salt Lake City, UT (US)

(72) Inventors: Yangyang Pan, San Jose, CA (US); Hao Zhong, San Jose, CA (US)

(73) Assignee: SanDisk Technologies, Inc., Plano, TX (US)

( * ) Notice: Subject to any disclaimer, the term of this patent is extended or adjusted under 35 U.S.C. 154(b) by 96 days.

(21) Appl. No.: 14/189,850

(22) Filed: Feb. 25, 2014

(65) Prior Publication Data

US 2015/0200688 A1    Jul. 16, 2015

Related U.S. Application Data

(60) Provisional application No. 61/925,757, filed on Jan. 10, 2014.

(51) Int. Cl.
*G06F 11/10* (2006.01)
*H03M 13/39* (2006.01)

(52) U.S. Cl.
CPC ................................ *H03M 13/3927* (2013.01)

(58) Field of Classification Search
CPC .................................................. G06F 11/1008
USPC .......... 714/763, 773, 758, 759, 721, 704, 794
See application file for complete search history.

(56) References Cited

U.S. PATENT DOCUMENTS

| | | | |
|---|---|---|---|
| 8,675,417 B2 * | 3/2014 | Litsyn et al. | 365/185.24 |
| 2010/0220514 A1 * | 9/2010 | Vigoda et al. | 365/149 |
| 2011/0261908 A1 * | 10/2011 | Chiang et al. | 375/341 |

OTHER PUBLICATIONS

Motwani, Ravi, "Low Density Parity Check (LDPC) Codes and the Need for Stronger ECC", Intel, Aug. 2011, pp. 18.
"Review of Micron 20nm TLC NAND Basics", Micron, Nov. 4, 2012, pp. 52.
Zhao, Kai, "LDPC-in-SSD: Making Advanced Error Correction Codes Work Effectively in Solid State Drives", Rensselaer Polytechnic Institute, downloaded Oct. 21, 2013, pp. 30, US.

* cited by examiner

*Primary Examiner* — Fritz Alphonse
(74) *Attorney, Agent, or Firm* — Kunzler Law Group, PC

(57) ABSTRACT

Apparatuses, systems, methods, and computer program products are provided for error correction. A soft read module is configured to obtain soft read information for a cell of a non-volatile memory medium. The soft read information may indicate a likelihood that a data value for the cell is correct. A reliability module is configured to associate the cell with a log-likelihood ratio (LLR) mapping from a plurality of LLR mappings based on one or more reliability characteristics for a set of cells that includes the cell. An LLR map module is configured to determine an LLR value based on the soft read information by using the LLR mapping.

20 Claims, 10 Drawing Sheets

First LLR Mapping 610

| Microstate | 0 | 1 | 2 | 3 | 4 | 5 |
|---|---|---|---|---|---|---|
| LLR | -7 | -5 | -3 | 3 | 5 | 7 |

Second LLR Mapping 620

| Microstate | 0 | 1 | 2 | 3 | 4 | 5 |
|---|---|---|---|---|---|---|
| LLR | -7 | -4 | -1 | 1 | 4 | 7 |

FIG. 6

DYNAMIC LOG-LIKELIHOOD RATIO MAPPING FOR ERROR CORRECTING CODE DECODING

CROSS-REFERENCES TO RELATED APPLICATIONS

This application claims the benefit of U.S. Provisional Patent Application No. 61/925,757 entitled "DYNAMIC LOG-LIKELIHOOD RATIO MAPPING FOR ERROR CORRECTING CODE DECODING" and filed on Jan. 10, 2014 for Yangyang Pan, et al., which is incorporated herein by reference.

TECHNICAL FIELD

The present disclosure, in various embodiments, relates to decoders for error correcting codes and more particularly relates to soft-decision decoders used to decode data stored by non-volatile media.

BACKGROUND

Several types of data storage devices, such as flash memory devices, store data in cells of non-volatile media. A physical property of each cell, such as a stored charge, voltage, material phase, electrical resistance, magnetization, or the like, is alterable to encode data. A cell's physical property may be variable across a range, which may be divided into discrete states, so that different states correspond to different data values. Sensing whether the cell's physical property satisfies one or more read thresholds (voltage thresholds, resistivity thresholds, or the like) within its range determines the cell's state, thus allowing recovery of a stored data value.

The data-encoding physical property of a cell may vary over time due to cell damage, charge leakage, temperature effects, disturbances from nearby cells, or the like. An error may occur if the cell moves from one state into an adjacent state. As storage density increases, feature size shrinks, making the cells more susceptible to such disturbances, and increasing error rates. Encoding data for storage with error correcting codes may compensate for such errors.

Soft-decision error correcting code (ECC) decoders achieve high error correction performance by operating on "soft" data, such as log-likelihood ratio (LLR) inputs, which indicate a data value and a probability that the data value is correct, unlike hard-decision decoders, which operate on non-probabilistic "hard" data. Using additional read thresholds for "soft sensing" may provide additional "soft read information" about a cell, which can be mapped to LLR values for a soft-decision ECC decoder. For example, a data value from a cell is more likely correct if soft read information indicates that the cell's physical property is in the middle of a state, and is more likely in error if soft read information indicates that the cell's physical property is near a boundary between states, where it may have moved from an adjacent state.

A mapping from soft read information to LLR values may provide accurate probabilistic data to an ECC decoder under certain conditions. However, leakage and other disturbances may increase with age, as cells are used over time. Therefore, a single, static mapping from soft read information to LLR values may provide less accurate probabilistic data to an ECC decoder, over time.

SUMMARY

Methods are presented for error correction. In one embodiment, a method includes determining soft read information for a cell of a non-volatile storage medium. In a further embodiment, the method includes determining one or more reliability characteristics for the cell. In certain embodiments, the method includes translating the soft read information to a log-likelihood ratio (LLR) value using an LLR mapping. The LLR mapping, in certain embodiments, is selected based on the one or more reliability characteristics. In some embodiments, the LLR value indicates a probability that a data value for the cell is correct.

Apparatuses are presented for error correction. In one embodiment, a soft read module is configured to obtain soft read data for a cell of a non-volatile memory medium. In a further embodiment, the soft read data may indicate a likelihood that a data value for the cell is correct. In certain embodiments, a reliability module is configured to associate the cell with an LLR mapping from a plurality of LLR mappings based on one or more reliability characteristics for a set of cells that includes the cell. In some embodiments, an LLR map module is configured to determine an LLR value based on the soft read data by using the LLR mapping.

An apparatus, in another embodiment, includes a reliability module configured to determine one or more reliability characteristics for a cell of a non-volatile recording medium. In a further embodiment, the apparatus includes a map select module configured to select an LLR mapping from a plurality of predefined LLR mappings based on the one or more reliability characteristics. In certain embodiments, the LLR mapping may include a mapping from soft read information to LLR values. In some embodiments, the apparatus includes a soft read module configured to gather the soft read information.

Computer program products are presented comprising a computer readable storage medium storing computer usable program code executable to perform operations for error correction. In one embodiment, the operations include sensing soft read information for a cell of a non-volatile storage medium. In a further embodiment, the operations include classifying the cell based on a program/erase cycle count for the cell and a retention time for data of the cell. In some embodiments, the operations include converting the soft read information to an LLR value using an LLR mapping.

BRIEF DESCRIPTION OF THE DRAWINGS

In order that the advantages of the disclosure will be readily understood, a more particular description of the disclosure briefly described above will be rendered by reference to specific embodiments that are illustrated in the appended drawings. Understanding that these drawings depict only typical embodiments of the disclosure and are not therefore to be considered to be limiting of its scope, the disclosure will be described and explained with additional specificity and detail through the use of the accompanying drawings, in which:

FIG. 6 is a set of tables illustrating two embodiments of LLR mappings;

DETAILED DESCRIPTION

Figure 1A:
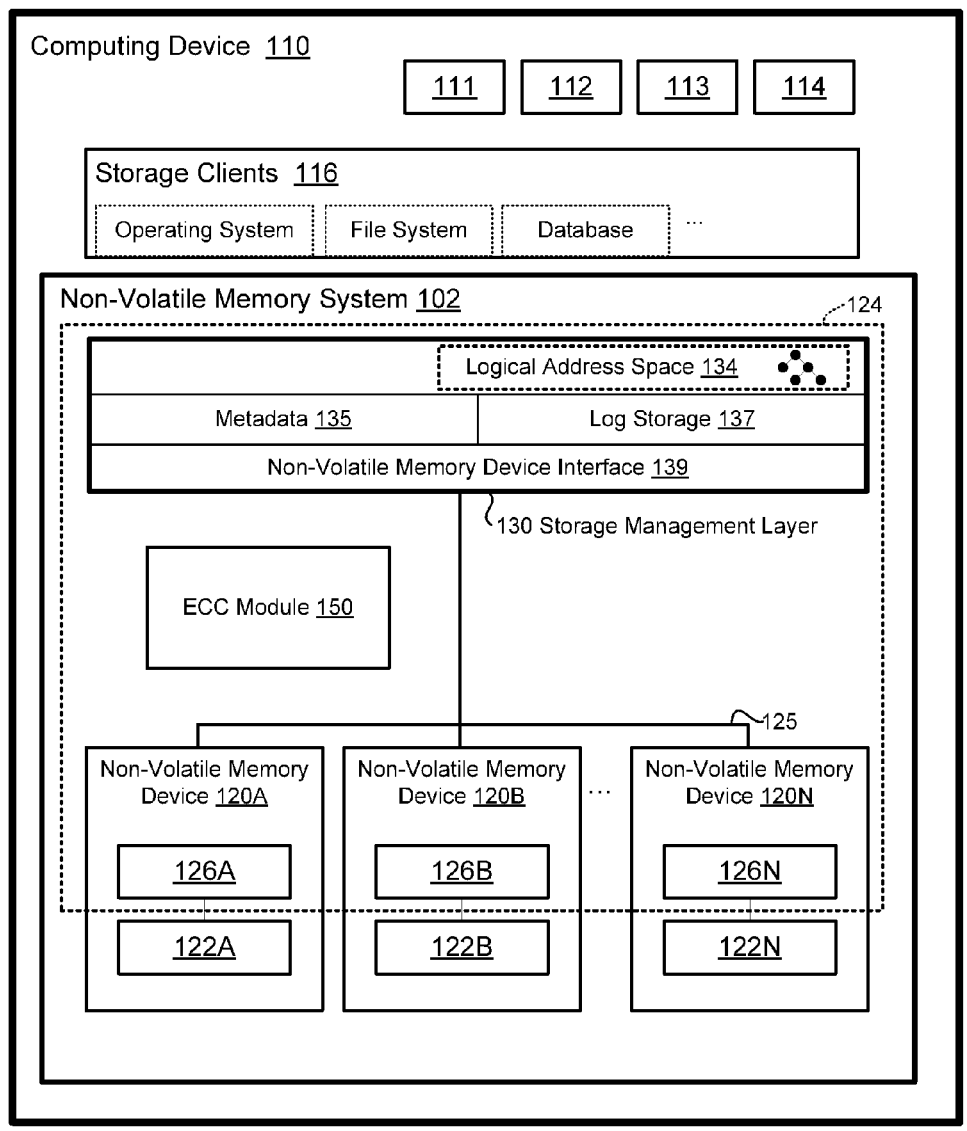
FIG. 1A is a schematic block diagram illustrating one embodiment of a non-volatile memory system comprising an error correcting code (ECC) module.

Aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable storage media having computer readable program code embodied thereon.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. Where a module or portions of a module are implemented in software, the software portions are stored on one or more computer readable storage media.

Any combination of one or more computer readable storage media may be utilized. A computer readable storage medium may be, for example, but not limited to, an electronic, magnetic, optical, electromagnetic, infrared, or semiconductor system, apparatus, or device, or any suitable combination of the foregoing.

More specific examples (a non-exhaustive list) of the computer readable storage medium would include the following: a portable computer diskette, a hard disk, a random access memory (RAM), a read-only memory (ROM), an erasable programmable read-only memory (EPROM or flash memory), phase change memory (PRAM or PCM), a portable compact disc read-only memory (CD-ROM), a digital versatile disc (DVD), a blu-ray disc, an optical storage device, a magnetic tape, a Bernoulli drive, a magnetic disk, a magnetic storage device, a punch card, integrated circuits, other digital processing apparatus memory devices, or any suitable combination of the foregoing, but would not include propagating signals. In the context of this document, a computer readable storage medium may be any tangible medium that can contain, or store a program for use by or in connection with an instruction execution system, apparatus, or device.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Furthermore, the described features, structures, or characteristics of the disclosure may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the disclosure. However, the disclosure may be practiced without one or more of the specific details, or with other methods, components, materials, and so forth. In other instances, well-known structures, materials, or operations are not shown or described in detail to avoid obscuring aspects of the disclosure.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the schematic flowchart diagrams and/or schematic block diagrams block or blocks.

These computer program instructions may also be stored in a computer readable storage medium that can direct a computer, other programmable data processing apparatus, or other devices to function in a particular manner, such that the instructions stored in the computer readable storage medium produce an article of manufacture including instructions which implement the function/act specified in the schematic flowchart diagrams and/or schematic block diagrams block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods and computer program products according to various embodiments of the present disclosure. In this regard, each block in the schematic flowchart diagrams and/or schematic block diagrams may represent a module, segment, or portion of code, which comprises one or more executable instructions for implementing the specified logical function(s).

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and computer instructions.

The description of elements in each figure may refer to elements of proceeding figures. Like numbers refer to like elements in all figures, including alternate embodiments of like elements.

According to various embodiments, a non-volatile memory controller manages one or more non-volatile memory devices. The non-volatile memory device(s) may comprise memory or storage devices, such as solid-state storage device(s), that are arranged and/or partitioned into a plurality of addressable media storage locations. As used herein, a media storage location refers to any physical unit of memory (e.g., any quantity of physical storage media on a non-volatile memory device). Memory units may include, but are not limited to: pages, memory divisions, erase blocks, sectors, blocks, collections or sets of physical storage locations (e.g., logical pages, logical erase blocks, described below), or the like.

The non-volatile memory controller may comprise a storage management layer (SML), which may present a logical address space to one or more storage clients. One example of an SML is the Virtual Storage Layer® of Fusion-io, Inc. of Salt Lake City, Utah. Alternatively, each non-volatile memory device may comprise a non-volatile memory media controller, which may present a logical address space to the storage clients. As used herein, a logical address space refers to a logical representation of memory resources. The logical address space may comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

The SML may maintain metadata, such as a forward index, to map logical addresses of the logical address space to media storage locations on the non-volatile memory device(s). The SML may provide for arbitrary, any-to-any mappings from logical addresses to physical storage resources. As used herein, an "any-to any" mapping may map any logical address to any physical storage resource. Accordingly, there may be no pre-defined and/or pre-set mappings between logical addresses and particular, media storage locations and/or media addresses. As used herein, a media address refers to an address of a memory resource that uniquely identifies one memory resource from another to a controller that manages a plurality of memory resources. By way of example, a media address includes, but is not limited to: the address of a media storage location, a physical memory unit, a collection of physical memory units (e.g., a logical memory unit), a portion of a memory unit (e.g., a logical memory unit address and offset, range, and/or extent), or the like. Accordingly, the SML may map logical addresses to physical data resources of any size and/or granularity, which may or may not correspond to the underlying data partitioning scheme of the non-volatile memory device(s). For example, in some embodiments, the non-volatile memory controller is configured to store data within logical memory units that are formed by logically combining a plurality of physical memory units, which may allow the non-volatile memory controller to support many different virtual memory unit sizes and/or granularities.

As used herein, a logical memory element refers to a set of two or more non-volatile memory elements that are or are capable of being managed in parallel (e.g., via an I/O and/or control bus). A logical memory element may comprise a plurality of logical memory units, such as logical pages, logical memory divisions (e.g., logical erase blocks), and so on.

As used herein, a logical memory unit refers to a logical construct combining two or more physical memory units, each physical memory unit on a respective non-volatile memory element in the respective logical memory element (each non-volatile memory element being accessible in parallel). As used herein, a logical memory division refers to a set of two or more physical memory divisions, each physical memory division on a respective non-volatile memory element in the respective logical memory element.

The logical address space presented by the storage management layer may have a logical capacity, which may correspond to the number of available logical addresses in the logical address space and the size (or granularity) of the data referenced by the logical addresses. For example, the logical capacity of a logical address space comprising $2^{32}$ unique logical addresses, each referencing 2048 bytes (2KiB) of data may be $2^{43}$ bytes. (As used herein, a kibibyte (KiB) refers to 1024 bytes). In some embodiments, the logical address space may be thinly provisioned. As used herein, a "thinly provisioned" logical address space refers to a logical address space having a logical capacity that exceeds the physical capacity of the underlying non-volatile memory device(s). For example, the storage management layer may present a 64-bit logical address space to the storage clients (e.g., a logical address space referenced by 64-bit logical addresses), which exceeds the physical capacity of the underlying non-volatile memory devices. The large logical address space may allow storage clients to allocate and/or reference contiguous ranges of logical addresses, while reducing the chance of naming conflicts. The storage management layer may leverage the any-to-any mappings between logical addresses and physical storage resources to manage the logical address space independently of the underlying physical storage devices. For example, the storage management layer may add and/or remove physical storage resources seamlessly, as needed, and without changing the logical addresses used by the storage clients.

The non-volatile memory controller may be configured to store data in a contextual format. As used herein, a contextual format refers to a self-describing data format in which persistent contextual metadata is stored with the data on the physical storage media. The persistent contextual metadata provides context for the data it is stored with. In certain embodiments, the persistent contextual metadata uniquely identifies the data that the persistent contextual metadata is stored with. For example, the persistent contextual metadata may uniquely identify a sector of data owned by a storage client from other sectors of data owned by the storage client. In a further embodiment, the persistent contextual metadata identifies an operation that is performed on the data. In a further embodiment, the persistent contextual metadata identifies a sequence of operations performed on the data. In a further embodiment, the persistent contextual metadata identifies security controls, a data type, or other attributes of the data. In certain embodiments, the persistent contextual metadata identifies at least one of a plurality of aspects, including data type, a unique data identifier, an operation, and a sequence of operations performed on the data. The persistent contextual metadata may include, but is not limited to: a logical address of the data, an identifier of the data (e.g., a file name, object id, label, unique identifier, or the like), reference(s) to other data (e.g., an indicator that the data is associated with other data), a relative position or offset of the data with respect to other data (e.g., file offset, etc.), data size and/or range, and the like. The contextual data format may comprise a packet format comprising a data segment and one or more headers. Alternatively, a contextual data format may associate data with context information in other ways (e.g., in a dedicated index on the non-volatile memory media, a memory division index, or the like).

In some embodiments, the contextual data format may allow data context to be determined (and/or reconstructed) based upon the contents of the non-volatile memory media, and independently of other metadata, such as the arbitrary, any-to-any mappings discussed above. Since the media location of data is independent of the logical address of the data, it may be inefficient (or impossible) to determine the context of data based solely upon the media location or media address of the data. Storing data in a contextual format on the non-volatile memory media may allow data context to be determined without reference to other metadata. For example, the contextual data format may allow the metadata to be reconstructed based only upon the contents of the non-volatile memory media (e.g., reconstruct the any-to-any mappings between logical addresses and media locations).

In some embodiments, the non-volatile memory controller may be configured to store data on one or more asymmetric, write-once media, such as solid-state storage media. As used herein, a "write once" storage medium refers to a storage medium that is reinitialized (e.g., erased) each time new data is written or programmed thereon. As used herein, an "asymmetric" storage medium refers to a storage medium having different latencies for different storage operations. Many types of solid-state storage media are asymmetric; for example, a read operation may be much faster than a write/program operation, and a write/program operation may be much faster than an erase operation (e.g., reading the media may be hundreds of times faster than erasing, and tens of times faster than programming the media). The memory media may be partitioned into memory divisions that can be erased as a group (e.g., erase blocks) in order to, inter alia, account for the asymmetric properties of the media. As such, modifying a single data segment in-place may require erasing the entire erase block comprising the data, and rewriting the modified data to the erase block, along with the original, unchanged data. This may result in inefficient "write amplification," which may excessively wear the media. Therefore, in some embodiments, the non-volatile memory controller may be configured to write data out-of-place. As used herein, writing data "out-of-place" refers to writing data to different media storage location(s) rather than overwriting the data "in-place" (e.g., overwriting the original physical location of the data). Modifying data out-of-place may avoid write amplification, since existing, valid data on the erase block with the data to be modified need not be erased and recopied. Moreover, writing data out-of-place may remove erasure from the latency path of many storage operations (the erasure latency is no longer part of the critical path of a write operation).

The non-volatile memory controller may comprise one or more processes that operate outside of the regular path for servicing of storage operations (the "path" for performing a storage operation and/or servicing a storage request). As used herein, the "path for servicing a storage request" or "path for servicing a storage operation" (also referred to as the "critical path") refers to a series of processing operations needed to service the storage operation or request, such as a read, write, modify, or the like. The path for servicing a storage request may comprise receiving the request from a storage client, identifying the logical addresses of the request, performing one or more storage operations on non-volatile memory media, and returning a result, such as acknowledgement or data. Processes that occur outside of the path for servicing storage requests may include, but are not limited to: a groomer, de-duplication, and so on. These processes may be implemented autonomously and in the background, so that they do not interfere with or impact the performance of other storage operations and/or requests. Accordingly, these processes may operate independent of servicing storage requests.

In some embodiments, the non-volatile memory controller comprises a groomer, which is configured to reclaim memory divisions (e.g., erase blocks) for reuse. The write out-of-place paradigm implemented by the non-volatile memory controller may result in obsolete or invalid data remaining on the non-volatile memory media. For example, overwriting data X with data Y may result in storing Y on a new memory division (rather than overwriting X in place), and updating the any-to-any mappings of the metadata to identify Y as the valid, up-to-date version of the data. The obsolete version of the data X may be marked as invalid, but may not be immediately removed (e.g., erased), since, as discussed above, erasing X may involve erasing an entire memory division, which is a time-consuming operation and may result in write amplification. Similarly, data that is no longer is use (e.g., deleted or trimmed data) may not be immediately removed. The non-volatile memory media may accumulate a significant amount of invalid data. A groomer process may operate outside of the critical path for servicing storage operations. The groomer process may reclaim memory divisions so that they can be reused for other storage operations. As used herein, reclaiming a memory division refers to erasing the memory division so that new data may be stored/programmed thereon. Reclaiming a memory division may comprise relocating valid data on the memory division to a new location. The groomer may identify memory divisions for reclamation based upon one or more factors, which may include, but are not limited to: the amount of invalid data in the memory division, the amount of valid data in the memory division, wear on the memory division (e.g., number of erase cycles), time since the memory division was programmed or refreshed, and so on.

The non-volatile memory controller may be further configured to store data in a log format. As described above, a log format refers to a data format that defines an ordered sequence of storage operations performed on a non-volatile memory media. In some embodiments, the log format comprises storing data in a pre-determined sequence of media addresses of the non-volatile memory media (e.g., within sequential pages and/or erase blocks of the media). The log format may further comprise associating data (e.g., each packet or data segment) with respective sequence indicators. The sequence indicators may be applied to data individually (e.g., applied to each data packet) and/or to data groupings (e.g., packets stored sequentially on a memory division, such as an erase block). In some embodiments, sequence indicators may be applied to memory divisions when the memory divisions are reclaimed (e.g., erased), as described above, and/or when the memory divisions are first used to store data.

In some embodiments the log format may comprise storing data in an "append only" paradigm. The non-volatile memory controller may maintain a current append point at a media address of the non-volatile memory device. The append point may be a current memory division and/or offset within a memory division. Data may then be sequentially appended from the append point. The sequential ordering of the data, therefore, may be determined based upon the sequence indicator of the memory division of the data in combination with the sequence of the data within the memory division. Upon reaching the end of a memory division, the non-volatile memory controller may identify the "next" available memory division (the next memory division that is initialized and ready to store data). The groomer may reclaim memory divisions comprising invalid, stale, and/or deleted data, to ensure that data may continue to be appended to the media log.

The log format described herein may allow valid data to be distinguished from invalid data based upon the contents of the non-volatile memory media, and independently of other metadata. As discussed above, invalid data may not be removed from the non-volatile memory media until the memory division comprising the data is reclaimed. Therefore, multiple "versions" of data having the same context may exist on the non-volatile memory media (e.g., multiple versions of data having the same logical addresses). The sequence indicators associated with the data may be used to distinguish invalid versions of data from the current, up-to-date version of the data; the data that is the most recent in the log is the current version, and previous versions may be identified as invalid.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description.

FIG. 1A is a block diagram of one embodiment of a system 100 comprising an error-correcting code (ECC) module 150. The ECC module 150 may be part of and/or in communication with a storage management layer (SML) 130. The SML 130 may operate on a non-volatile memory system 102 of a computing device 110, which may comprise a processor 111, volatile memory 112, and a communication interface 113. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 (and/or non-volatile memory controller 124) to a communication network, such as a Internet Protocol network, a Storage Area Network, or the like.

The computing device 110 may further comprise a non-transitory, computer readable storage media 114. The computer readable storage media 114 may comprise executable instructions configured to cause the computing device 110 (e.g., processor 111) to perform steps of one or more of the methods disclosed herein. Alternatively, or in addition, the storage management layer 130 and/or one or more modules thereof may be embodied as one or more computer readable instructions stored on the non-transitory storage media 114.

The storage management layer 130 may be configured to provide storage services to one or more storage clients 116. The storage clients 116 may include local storage clients 116 operating on the computing device 110 and/or remote, storage clients 116 accessible via the network (and network interface 113). The storage clients 116 may include, but are not limited to: operating systems, file systems, database applications, server applications, kernel-level processes, user-level processes, applications, and the like.

Figure 1B:
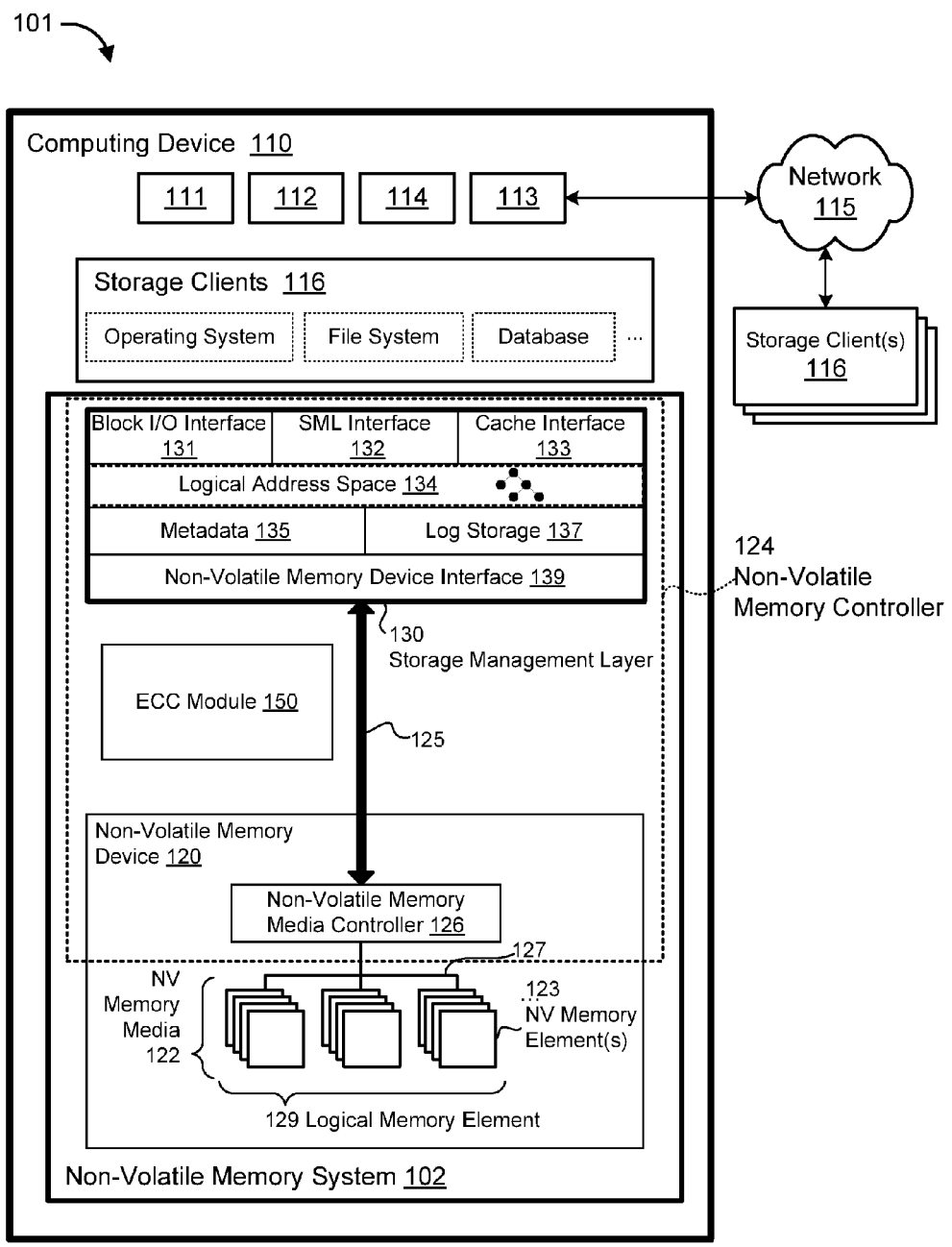
FIG. 1B is a schematic block diagram illustrating another embodiment of a non-volatile memory system comprising an ECC module.

The storage management layer 130 comprises and/or is communicatively coupled to one or more non-volatile memory devices 120A-N. The non-volatile memory devices 120A-N may include different types of non-volatile memory devices including, but not limited to: solid-state storage devices, hard drives, SAN storage resources, or the like. The non-volatile memory devices 120A-N may comprise respective non-volatile memory media controllers 126A-N and non-volatile memory media 122A-N. As illustrated in FIG. 1B, The SML 130 may provide access to the non-volatile memory devices 120A-N via a traditional block I/O interface 131. Additionally, the SML 130 may provide access to enhanced functionality (large, virtual address space) through the SML interface 132. The metadata 135 may be used to manage and/or track storage operations performed through any of the Block I/O interface 131, SML interface 132, cache interface 133, or other, related interfaces.

The cache interface 133 may expose cache-specific features accessible via the storage management layer 130. Also, in some embodiments, the SML interface 132 presented to the storage clients 116 provides access to data transformations implemented by the non-volatile memory devices 120A-N and/or the non-volatile memory media controllers 126A-N.

The SML 130 may provide storage services through one or more interfaces, which may include, but are not limited to: a block I/O interface, an extended storage management layer interface, a cache interface, and the like. The SML 130 may present a logical address space 134 to the storage clients 116 through one or more interfaces. As discussed above, the logical address space 134 may comprise a plurality of logical addresses, each corresponding to respective media locations on one or more of the non-volatile memory devices 120A-N. The SML 130 may maintain metadata 135 comprising any-to-any mappings between logical addresses and media locations, as described above.

The SML 130 may further comprise a log storage module 137 that is configured to store data in a contextual, log format. The contextual, log data format may comprise associating data with persistent contextual metadata, such as the logical address of the data, or the like. The contextual, log format may further comprise associating data with respective sequence identifiers on the non-volatile memory media 122A-N, which define an ordered sequence of storage operations performed on the non-volatile memory devices 120A-N, as described above.

The SML 130 may further comprise a non-volatile memory device interface 139 configured to transfer data, commands, and/or queries to the non-volatile memory devices 120A-N over a bus 125, which may include, but is not limited to: a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network, Infiniband, SCSI RDMA, or the like. The non-volatile memory device interface 139 may communicate with the non-volatile memory devices 120A-N using input-output control (IO-CTL) command(s), IO-CTL command extension(s), remote direct memory access, or the like.

The non-volatile memory system 102, in the depicted embodiment, includes an ECC module 150. The ECC module 150, in various embodiments, is configured to encode and/or decode data using an error correcting code. In one embodiment, the ECC module 150 may determine soft read information for a cell of a non-volatile memory medium 122. In a further embodiment, the ECC module 150 may determine a reliability category for a set of cells that includes the cell, such as a physical or logical page, physical or logical erase block, or the like. In certain embodiments, the ECC module 150 may translate the soft read information to a log-likelihood ratio (LLR) value using an LLR mapping. A soft-decision ECC decoder may use LLR values for the set of cells to decode data stored by the set of cells. In some embodiments, the LLR mapping may be based on a measured performance of cells in the reliability category. Measuring the performance of cells in a reliability category, and selecting an LLR mapping accordingly, may provide higher error correction performance than selecting an LLR mapping without measuring the performance of cells in the reliability category, or using a single, static LLR mapping.

In one embodiment, the ECC module 150 may comprise executable software code, such as a device driver, SML 130, or the like, stored on the computer readable storage media 114 for execution on the processor 111. In another embodiment the ECC module 150 may comprise logic hardware of one or more of the non-volatile memory devices 120A-N, such as a non-volatile memory media controller 126A-N, a non-volatile memory controller 124, a device controller, a field-programmable gate array (FPGA) or other programmable logic, firmware for an FPGA or other programmable logic, microcode for execution on a microcontroller, an application-specific integrated circuit (ASIC), or the like. In a further embodiment, the ECC module 150 may include a combination of both executable software code and logic hardware.

In one embodiment, the ECC module 150 is configured to encode or decode data in response to receiving storage requests from the SML 130 via a bus 125 or the like. The ECC module 150 may be further configured to transfer data to/from the SML 130 and/or storage clients 116 via the bus 125. Accordingly, the ECC module 150, in some embodiments, may comprise and/or be in communication with one or more direct memory access (DMA) modules, remote DMA modules, bus controllers, bridges, buffers, and so on to facilitate the transfer of storage requests and associated data. In another embodiment, the ECC module 150 may receive storage requests as an API call from a storage client 116, as an IO-CTL command, or the like. The ECC module 150 is described in greater detail below with regard to FIGS. 3 and 4.

FIG. 1B is a block diagram of another embodiment of a system 101 comprising an ECC module 150. As described above, the ECC module 150 may be part of and/or in communication with a storage management layer 130. The SML 130 may operate on a non-volatile memory system 102 of a computing device 110, which, as discussed above, may comprise a processor 111, volatile memory 112, communication interface 113, and non-transitory, computer readable storage media 114. The communication interface 113 may comprise one or more network interfaces configured to communicatively couple the computing device 110 (and/or non-volatile memory controller 124) to a network 115 and/or to one or more remote, network-accessible storage clients 116.

The computing device 110 may comprise a non-volatile memory controller 124 that is configured to provide storage services to the storage clients 116. The storage clients 116 may include local storage clients 116 operating on the computing device 110 and/or remote, storage clients 116 accessible via the network 115 (and network interface 113). The non-volatile memory controller 124 comprises one or more non-volatile memory devices 120. Although FIG. 1B depicts a single non-volatile memory device 120, the disclosure is not limited in this regard and could be adapted to incorporate any number of non-volatile memory devices 120.

The non-volatile memory device 120 may comprise non-volatile memory media 122, which may include but is not limited to: NAND flash memory, NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), resistive RAM (RRAM), programmable metallization cell (PMC), conductive-bridging RAM (CBRAM), magneto-resistive RAM (MRAM), dynamic RAM (DRAM), phase change memory (PRAM or PCM), magnetic storage media (e.g., hard disk, tape), optical storage media, or the like. While the non-volatile memory media 122 is referred to herein as "memory media," in various embodiments, the non-volatile memory media 122 may more generally comprise a non-volatile recording media capable of recording data, which may be referred to as a non-volatile memory media, a non-volatile storage media, or the like. Further, the non-volatile memory device 120, in various embodiments, may comprise a non-volatile recording device, a non-volatile memory device, a non-volatile storage device, or the like.

The non-volatile memory media 122 may comprise one or more non-volatile memory elements 123, which may include, but are not limited to: chips, packages, planes, die, and the like. A non-volatile memory media controller 126 may be configured to manage storage operations on the non-volatile memory media 122, and may comprise one or more processors, programmable processors (e.g., field-programmable gate arrays), or the like. In some embodiments, the non-volatile memory media controller 126 is configured to store data on (and read data from) the non-volatile memory media 122 in the contextual, log format described above, and to transfer data to/from the non-volatile memory device 120, and so on.

The non-volatile memory media controller 126 may be communicatively coupled to the non-volatile memory media 122 by way of a bus 127. The bus 127 may comprise an I/O bus for communicating data to/from the non-volatile memory elements 123. The bus 127 may further comprise a control bus for communicating addressing and other command and control information to the non-volatile memory elements 123. In some embodiments, the bus 127 may communicatively couple the non-volatile memory elements 123 to the non-volatile memory media controller 126 in parallel. This parallel access may allow the non-volatile memory elements 123 to be managed as a group, forming a logical memory element 129. As discussed above, the logical memory element may be partitioned into respective logical memory units (e.g., logical pages) and/or logical memory divisions (e.g., logical erase blocks). The logical memory units may be formed by logically combining physical memory units of each of the non-volatile memory elements. For example, if the non-volatile memory media 122 comprises twenty-five (25) non-volatile memory elements, each logical memory unit may comprise twenty-five (25) pages (a page of each element of non-volatile memory media 122).

The non-volatile memory controller 124 may comprise a SML 130 and the non-volatile memory media controller 126. The SML 130 may provide storage services to the storage clients 116 via one or more interfaces 131, 132, and/or 133. In some embodiments, the SML 130 provides a block-device I/O interface 131 through which storage clients 116 perform block-level I/O operations. Alternatively, or in addition, the SML 130 may provide a storage management layer (SML) interface 132, which may provide other storage services to the storage clients 116. In some embodiments, the SML interface 132 may comprise extensions to the block device interface 131 (e.g., storage clients 116 may access the SML interface 132 through extensions to the block device interface 131). Alternatively, or in addition, the SML interface 132 may be provided as a separate API, service, and/or library. The SML 130 may be further configured to provide a cache interface 133 for caching data using the non-volatile memory system 102.

As described above, the SML 130 may present a logical address space 134 to the storage clients 116 (through the interfaces 131, 132, and/or 133). The SML 130 may maintain metadata 135 comprising any-to-any mappings between logical addresses in the logical address space 134 and media locations on the non-volatile memory device 120. The metadata 135 may comprise a logical-to-physical mapping structure with entries that map logical addresses in the logical address space 134 and media locations on the non-volatile memory device 120. The logical-to-physical mapping structure of the metadata 135, in one embodiment, is sparsely populated, with entries for logical addresses for which the non-volatile memory device 120 stores data and with no entries for logical addresses for which the non-volatile memory device 120 does not currently store data. The metadata 135, in certain embodiments, tracks data at a block level, with the SML 130 managing data as blocks.

The non-volatile memory system 102 may further comprise a log storage module 137, which, as described above, may be configured to store data on the non-volatile memory device 120 in a contextual, log format. The contextual, log data format may comprise associating data with a logical address on the non-volatile memory media 122. The contextual, log format may further comprise associating data with respective sequence identifiers on the non-volatile memory media 122, which define an ordered sequence of storage operations performed on the non-volatile memory media 122, as described above. The non-volatile memory controller 124 may further comprise a non-volatile memory device interface 139 that is configured to transfer data, commands, and/or queries to the non-volatile memory media controller 126 over a bus 125, as described above.

Figure 2:
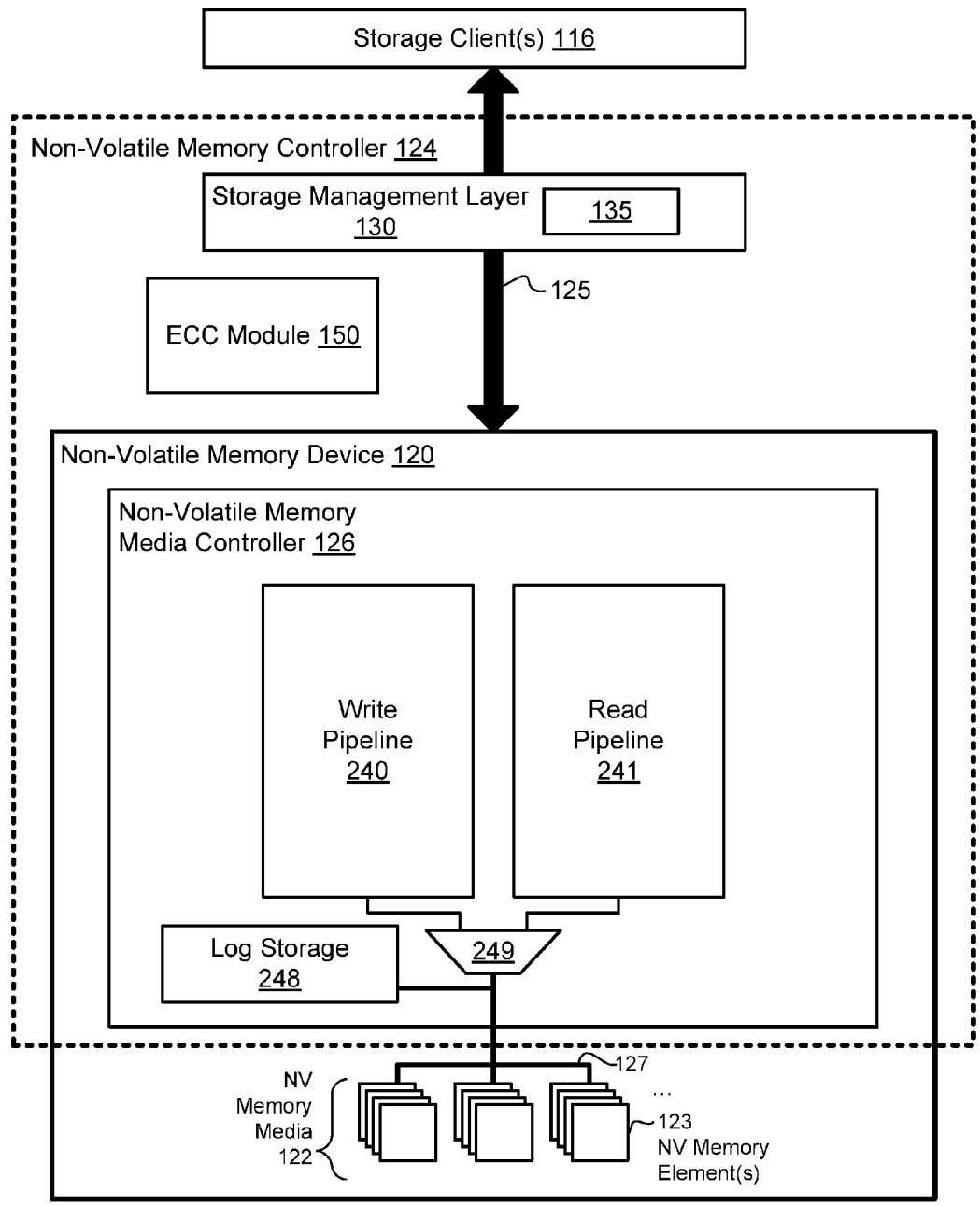
FIG. 2 is a schematic block diagram illustrating a further embodiment of a non-volatile memory system comprising an ECC module.

FIG. 2 depicts another embodiment of a non-volatile memory controller 124 configured to encode and/or decode data using an error correcting code. The non-volatile memory device 120 may comprise a non-volatile memory media controller 126 and non-volatile memory media 122. The non-volatile memory media 122 may comprise a plurality of non-volatile memory elements 123, which may be communicatively coupled to the non-volatile memory media controller 126 via a bus 127, as described above.

The non-volatile memory media controller 126 may comprise a write pipeline 240 that is configured to store data on the non-volatile memory media 122 in a contextual format in response to requests received via the bus 125. The requests may include and/or reference data to be stored on the non-volatile memory media 122, may include logical address(es) of the data, and so on. As described above, the contextual format may comprise storing a logical address of the data in association with the data on the non-volatile memory media 122. For example, the write pipeline 240 may be configured to format data into packets, and may include the logical address of the data in a packet header (or other packet field). The write pipeline 240 may be configured to buffer data for storage on the non-volatile memory media 122. In some embodiments, the write pipeline 240 may comprise one or more synchronization buffers to synchronize a clock domain of the non-volatile memory media controller 126 with a clock domain of the non-volatile memory media 122 (and/or bus 127).

The log storage module 248 may be configured to select media location(s) for the data and may provide addressing and/or control information to the non-volatile memory elements 123 via the bus 127. In some embodiments, the log storage module 248 is configured to store data sequentially in a log format within the non-volatile memory media. The log storage module 248 may be further configured to groom the non-volatile memory media, as described above. In certain embodiments the log storage module 248 is substantially similar to the log storage module 137 as described above. The log storage module 248 may be executed by the SML 130 and/or by the non-volatile memory media controller 126.

Upon writing data to the non-volatile memory media, the non-volatile memory media controller 126 may be configured to update metadata 135 (e.g., a forward index) to associate the logical address(es) of the data with the media address(es) of the data on the non-volatile memory media 122. In some embodiments, the metadata 135 may be maintained on the non-volatile memory media controller 126; for example, the metadata 135 may be stored on the non-volatile memory media 122, on a volatile memory (not shown), or the like. Alternatively, or in addition, the metadata 135 may be maintained within the SML 130 (e.g., on a volatile memory 112 of the computing device 110 of FIGS. 1A and 1B). In some embodiments, the metadata 135 may be maintained in a volatile memory by the SML 130, and may be periodically stored on the non-volatile memory media 122.

The non-volatile memory media controller 126 may further comprise a read pipeline 241 that is configured to read contextual data from the non-volatile memory media 122 in response to requests received via the bus 125. The requests may comprise a logical address of the requested data, a media address of the requested data, and so on. The read pipeline 241 may be configured to read data stored in a contextual format from the non-volatile memory media 122 and to provide the data to the SML 130 and/or a storage client 116. The read pipeline 241 may be configured to determine the media address of the data using a logical address of the data and the metadata 135. Alternatively, or in addition, the SML 130 may determine the media address of the data and may include the media address in the request. The log storage module 248 may provide the media address to the non-volatile memory elements 123, and the data may stream into the read pipeline 241 via a buffer. The read pipeline 241 may comprise one or more read synchronization buffers for clock domain synchronization, as described above.

The non-volatile memory media controller 126 may further comprise a multiplexer 249 that is configured to selectively route data and/or commands to/from the write pipeline 240 and the read pipeline 241. In some embodiments, non-volatile memory media controller 126 may be configured to read data while filling a buffer of the write pipeline 240 and/or may interleave one or more storage operations on one or more banks of non-volatile memory elements 123 (not shown).

Figure 3:
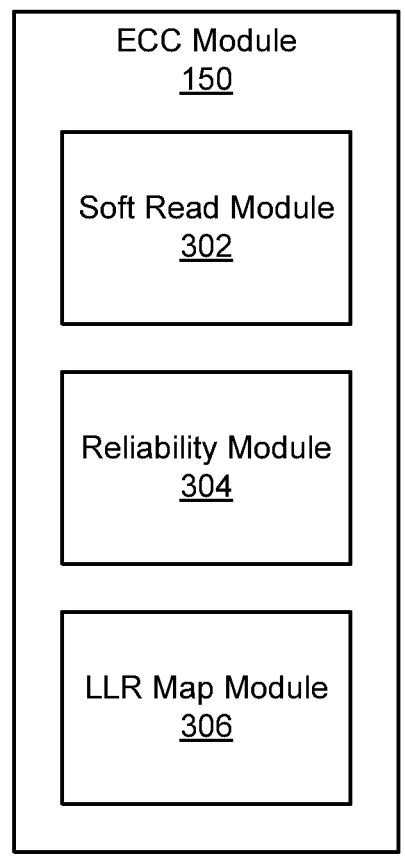
FIG. 3 is a schematic block diagram illustrating one embodiment of an ECC module.

FIG. 3 depicts one embodiment of an ECC module 150. The ECC module 150 may be substantially similar to the ECC module 150 described above with regard to FIGS. 1A, 1B, and 2. In general, as described above, the ECC module 150 may encode data for storage on the non-volatile memory media 122 and/or decode data read from the non-volatile memory media 122 using an error correcting code. In certain embodiments, the ECC module 150 may determine soft read information for a cell of a non-volatile memory medium 122, determine a reliability category for a set of cells that includes the cell, and translate the soft information to an LLR value by using an LLR mapping that is based on measured performance of cells in the same reliability category. In the depicted embodiment, the ECC module 150 includes a soft read module 302, a reliability module 304, and an LLR map module 306.

The soft read module 302, in one embodiment, is configured to determine, read, sense, gather, or otherwise obtain soft read information for a cell of a non-volatile memory medium 122. In various embodiments, a means for gathering soft read information may include a soft read module 302, an ECC module 150, a non-volatile memory controller 124, a non-volatile memory media controller 126, a device driver such as an SML 130, a processor 111, a read pipeline 241, other logic hardware and/or other executable code stored on a computer readable storage medium. Other embodiments may include similar or equivalent means for gathering soft read information.

In one embodiment, the non-volatile memory device 120 may be in communication with a host device, such as a computing device 110, over a communications bus, such as the bus 125. In certain embodiments, the non-volatile memory media 122 of the non-volatile memory device 120 includes a plurality of storage cells. As used herein, a "cell" refers to the smallest physical unit of storage or memory in a non-volatile memory medium 122. In some embodiments, each cell has a physical and/or electrical property which may be altered to encode or otherwise store data. For example, in flash memory, a cell may include a floating gate transistor, and the physical property used to encode data may be the charge stored on the floating gate, a stored read voltage level caused by the charge stored on the floating gate, the threshold voltage $V_t$ that is sufficient to make the transistor conduct when applied to the control gate, or the like. As another example, in phase change memory, a cell may be a region of chalcogenide glass, and the physical property used to encode data may be the degree of crystallization of the region, the electrical resistance of the cell, or the like. As described above with regard to non-volatile memory media 122, many types of cells may store data of a non-volatile memory device 120 for use with the ECC module 150.

In one embodiment, the range of possible values for the data-encoding physical property of a cell is divided into discrete states or abodes, so that each state encodes one or more possible data values. In some embodiments, the states are configured to encode values for a plurality of bits. For example, if a cell stores two bits using four states, each state may encode a different value for the two bits of the cell, such as "11," "01," "00," or "10." In a further embodiment, the states of a cell may be separated by guard bands. As used herein, a "state" or "abode" refers to a sub-range of possible values for the data-encoding physical property of a cell, so that each state corresponds to a single set of one or more data values.

In some embodiments, reading data from a cell may involve sensing whether the cell's physical property satisfies one or more read thresholds, to determine the cell's state. A read threshold, in various embodiments, may be a voltage threshold, resistivity threshold, or the like, so that many types of read thresholds are possible, corresponding to the various types of non-volatile memory media 122. For example, in one embodiment, a read voltage threshold for a flash memory cell comprising a floating gate transistor may comprise a voltage applied to the control gate, so that sensing whether the transistor conducts when the read voltage threshold is applied determines whether a stored read voltage for the cell is above or below the read threshold. As another example, a read threshold for a phase change memory cell may be a resistivity threshold, and reading data from the cell may include determining whether the resistivity of the cell is above or below the read threshold.

In one embodiment, the number of read thresholds for a cell may be a minimum number for determining which state a cell is in. In a further embodiment, the minimum number may be equal to the number of states per cell, minus one. For example, single-level cell (SLC) flash memory, which uses two states to store one bit per cell, may use one read threshold to determine which state a cell is in. Similarly, multi-level cell (MLC) flash memory, which uses four states to store two bits per cell, may use three read thresholds to determine which state a cell is in, and triple-level cell (TLC) flash memory may use seven read thresholds to determine which of eight states a cell is in, and recover a three-bit data value. Cells with other numbers of states may similarly use a minimum number of read thresholds at boundaries between states to determine the state of a cell. In certain embodiments, a minimum set of read thresholds for determining the state of a cell may be referred to as "hard" read thresholds, and reading data from a cell using hard read thresholds (without additional thresholds) may be referred to as "hard" reading or sensing. In some embodiments, hard read thresholds may be sufficient for reading cells that are not expected to move near or across the boundaries between states.

However, in some embodiments, a cell's data-encoding physical property may move near or across a boundary between states. This tendency to move may become more pronounced due to wear as the cell ages or is used over time. For example, electrical stressing from programming and/or erasing flash memory cells may create defects in an oxide layer, so that charge leaks from a floating gate, through the oxide layer, over time. Programming, erasing, or reading nearby cells may cause similar movement in the data-encoding physical property of a cell. Different types of cells may experience a variety of different types of error-causing phenomena.

Errors may occur due to such phenomena if a cell moves from one state into another state, thus changing the data value stored by the cell. Accordingly, data to be stored by non-volatile memory devices 120 may be encoded using an error correcting code, such as a block code, a convolutional code, a Bose-Chaudhuri-Hocquenghem (BCH) code, a low-density parity check (LDPC) code, a Hamming code, a Reed-Solomon code, a turbo code, or the like. By decoding the error correcting code, an ECC decoder, such as an LDPC code decoder, a BCH code decoder, or the like may detect and/or correct errors, allowing retrieval of the original, unencoded data.

As non-volatile memory technology scales down to smaller feature sizes, cells become more susceptible to error-causing phenomena, which may increase error rates. Accordingly, a non-volatile memory system 102 may use stronger error correction. An ECC decoder processes a code word and detects whether there are errors in the code word and if there are errors corrects an number of errors up to a maximum number of correctable errors. ECC decoders may include one or more of a hard-decision ECC decoder and a soft-decision ECC decoder. For example, in one embodiment, a non-volatile memory system may use a hard-decision ECC decoder, which operates on non-probabilistic data values (based on hard read thresholds) to provide a first level of error correction, and may use a soft-decision ECC decoder, which operates on probabilistic data indicating the reliability of different data values, to provide a stronger level of error correction. In various embodiments, a soft-decision ECC decoder may include a soft-decision LDPC code decoder, a soft-decision Viterbi decoder for a convolutional code, a soft-decision Turbo code decoder, or the like; many types of soft-decision decoders are available corresponding to various types of error correcting codes.

Although hard read thresholds may provide sufficient information for a hard-decision ECC decoder, additional read thresholds may be used to provide the additional information used by a soft-decision ECC decoder. Accordingly, in another embodiment, the number of read thresholds for a cell may be more than a minimum number for determining which state a cell is in. In certain embodiments, a set of read thresholds that includes more read thresholds than are needed to determine the state of the cell may be referred to as "soft" read thresholds, and reading data from a cell using soft read thresholds may be referred to as "soft" reading or sensing. Similarly, just as the hard read thresholds may correspond to a cell's states, soft read thresholds may correspond to "microstates" for a cell, having a greater granularity than the states that encode data values. Because soft read thresholds, in certain embodiments, include more than a single, hard read threshold for determining the state of a cell, soft reading or soft sensing may comprise read oversampling (e.g., performing multiple reads for a single read boundary).

In one embodiment, a set of soft read thresholds may include three read thresholds at or near a boundary between states: one at the boundary between states, and one on either side. In another embodiment, a set of soft read thresholds may include five read thresholds at or near a boundary between states: one at the boundary between states, and two on either side.

Additional configurations of soft read thresholds are possible. In one embodiment, soft reading or sensing may be an iterative process involving issuing a separate read command for each soft read voltage threshold. For example, in certain embodiments, the non-volatile memory media 122 may not support soft reads using multiple soft read thresholds in response to a native single soft read command. In embodiments where the non-volatile memory media 122 does not support a native soft read command, the soft read module 302 may perform a soft read operation by iteratively setting different single read thresholds (e.g., moving a hard read threshold to different values for each manually created "soft read" threshold) and issuing a read command for each different manually created "soft read" threshold to determine whether a cell satisfies the manually created "soft read" threshold. The soft read module 302 may continue the iterative process until the soft read module 302 has used each of the manually created "soft read" threshold for a read operation. The soft read module 302 may process or combine the results of the multiple read operations into a soft read information format (e.g., a multi-bit value comprising each result, a vector comprising a direction indicating a binary value and a magnitude indicating a likelihood that the value is correct, or the like). In certain embodiments, the soft read module 302 may move or adjust the read threshold back to its original, hard read threshold value.

In another embodiment, the non-volatile memory device 120 may be configured to automatically provide soft read information in response to a single soft read command, performing multiple sub-read operations with different soft read voltage thresholds or the like. Using a soft read to determine which microstate a cell is in provides additional indication of the cell's reliability, which may be used by a soft-decision ECC decoder. For example, a data value from a cell is more likely correct if the cell is in a microstate near the middle of a state, and is more likely in error if the cell has moved to a microstate near a boundary between states. States, microstates, hard read thresholds, and soft read thresholds are described in greater detail below with regard to FIGS. 5A and 5B.

In one embodiment, the soft read module 302 may determine, read, sense, or otherwise obtain soft read information by soft reading or soft sensing, as described above. As used herein, "soft read information" and "soft read data" comprises data indicating an accuracy and/or quality of a data value determined for a storage cell (e.g., a probability or confidence that the data value is correct). Soft read information may comprise more information regarding a state of the cell than would a "hard read," which may provide a single bit value. For example, in one embodiment, soft read information or soft read data comprises a probability of a bit being a binary one or a binary zero, such as a value between zero and one with values closer to one having a higher probability of a binary one and values closer to zero having a higher probability of a binary zero. In another embodiment, soft read information or soft read data may comprise a vector that includes both a direction indicating bit value (e.g., positive for a binary zero and negative for a binary one or vice versa) and a magnitude indicating a probability or confidence that the direction indicating bit value is correct. Soft read information or soft read data, in one embodiment, may include an actual or approximate stored read voltage level for a cell, in volts or the like.

In a further embodiment, the soft read information may include a multiple-bit value (e.g., multiple bits of information associated with a single bit stored by a cell), and individual bits of the multiple bit value may indicate whether the cell satisfies corresponding soft read thresholds. For example, in one embodiment, an SLC flash cell may store one bit, and the soft read module 302 may read five bits of soft read information, so that each bit indicates whether the cell satisfies one of five soft read thresholds for the cell. In another embodiment, however, the individual bits of soft read information may not directly correspond to individual soft read thresholds. For example, in certain embodiments, three soft read thresholds for a cell may define boundaries between four microstates, and the soft read module 302 may determine two bits of soft read information, which are sufficient to indicate the microstate of the cell. It is clear, in light of this disclosure, that many different types and configurations of soft read information are possible.

In one embodiment, the soft read module 302 may obtain soft read data that indicates whether the cell satisfies soft read thresholds, and may select the soft read thresholds based on one or more reliability characteristics received from the reliability module 304, as described below. In another embodiment, the soft read module 302 may adjust, determine, select, and/or set a hard read threshold based on the one or more reliability characteristics received from the reliability module 304. In certain embodiments, the soft read module 302 may determine, adjust, and/or set the hard read threshold prior to obtaining soft read data, and may determine, adjust, select, and/or set one or more soft read thresholds associated with the hard read threshold, so that the resulting soft read data indicates a probability of whether the cell satisfies the hard read threshold. In some embodiments, soft read data based on one or more read thresholds that correspond to a reliability characteristic of the cell may allow more accurate ECC decoding than soft read data based on static read thresholds. Determining and adjusting read voltage thresholds based on reliability characteristics (e.g., media characteristics) is described in greater detail with regard to U.S. patent application Ser. No. 14/106,566 entitled "MANAGING NON-VOLATILE MEDIA" and filed on Dec. 13, 2013 for John Strasser, et al., which is incorporated herein by reference in its entirety.

The reliability module 304, in one embodiment, is configured to determine a reliability category or a reliability characteristic for the cell from which the soft read module 302 obtained soft read information, or for a set of cells comprising the cell. In certain embodiments, the reliability module 304 may be configured to associate the cell with an LLR mapping (e.g., a mapping from soft read information to LLR values) based on one or more reliability characteristics for the set of cells. In further embodiments, the reliability module 304 may categorize or classify the cell according to a reliability category for the set of cells. In various embodiments, a means for determining one or more reliability characteristics for the cell may include a reliability module 304, an ECC module 150, a non-volatile memory controller 124, a non-volatile memory media controller 126, a device driver such as an SML 130, a processor 111, a read pipeline 241, other logic hardware and/or other executable code stored on a computer readable storage medium. Other embodiments may include similar or equivalent means for determining reliability characteristics.

In various embodiments, the set of cells may refer to any grouping of cells of the non-volatile storage medium 122 which includes the cell from which the soft read module 302 obtained soft read information. For example, in certain embodiments, the set of cells may be a physical or logical page, physical or logical erase block, chip, die, die plane, plurality of chips, dies, or die planes, or the like. In some embodiments, the reliability module 304 may determine a reliability category or characteristic for a set of cells such as a page or erase block to group similar cells together, thus avoiding the metadata and processing overhead that would be required to characterize each cell.

In one embodiment, a reliability characteristic may refer to any characteristic of the set of cells that relates to the reliability of the set of cells. For example, in another embodiment, a reliability characteristic may be any characteristic which affects a cell's tendency to move between states, such as a program/erase cycle count (or another type of write count), a read count, a retention time, an age of the non-volatile memory media 122 (e.g., time since first powered on, amount of time powered on, or the like), an error rate (such as a raw bit error rate, an uncorrectable bit error rate, or the like), a temperature (e.g., current or historical maximum temperature), whether or not the non-volatile memory media 122 includes an air gap between cells, whether the cells are SLC cells, MLC cells, TLC cells or a mixture of types of cells, manufacturer, batch, geometry size, type of non-volatile memory media 122, or the like.

In a further embodiment, a reliability category may be a category defined according to one or more reliability characteristics. For example, in one embodiment, the reliability module 304 may categorize the set of cells according to a reliability category defined for cells having a program/erase cycle count between 1,000 and 2,000. In another embodiment, the reliability module 304 may categorize the set of cells according to a reliability category defined for cells having a read count between 100,000 and 200,000. In a further embodiment, a reliability category may be defined according to a combination of reliability characteristics. For example, in one embodiment, a reliability category could be defined for cells having a program/erase cycle count less than 1,000 and a retention time (e.g., time since the last write or refresh of data within the set of cells) of less than one month. In various embodiments, the reliability module 304 may categorize the set of cells using various reliability categories based on reliability characteristics such as program/erase cycle count, read count, retention time, age, error rate, temperature, type of non-volatile memory media 122, manufacturer batch, geometry size, or the like, either alone or in combination.

The reliability module 304 or ECC module 150 may associate the cell with a log-likelihood ratio (LLR) mapping (e.g., a function or table that converts soft read information to LLR values for a soft-decision ECC decoder) based on a reliability category, or one or more reliability characteristics. Various reliability characteristics may affect cells' tendency to move between microstates, so the distribution of microstates may be different for sets of cells in different reliability categories. Therefore, a mapping from soft read information to LLR values may provide accurate probabilistic data to a soft-decision ECC decoder for a set of cells in one reliability category, but may not provide accurate probabilistic data to a soft-decision ECC decoder for a set of cells in another reliability category.

Accordingly, associating the cell with an LLR mapping based on a reliability category or reliability characteristic for the cell may provide better error correction performance than using a single, static LLR mapping. Additionally, in certain embodiments, proactively determining a reliability characteristic and an LLR mapping based on that reliability characteristic may reduce or eliminate a reactive trial and error process for selecting an optimal LLR mapping, allowing the reliability module 304 to select the LLR mapping to prevent errors from occurring, instead of waiting for errors to occur. A proactive approach using predetermined LLR mappings for different reliability characteristics may reduce decoding times or error correction times when compared to a reactive, trial and error approach, which may require multiple decodes with different LLR mappings. Proactive, predetermined LLR mappings based on reliability characteristics, may provide predictive information about a cell's performance and may provide more useful information to a soft ECC decoder than the information that may be obtained by switching LLR mappings reactively (e.g., in response to high error rates) or by trial and error.

In certain embodiments, certain reliability characteristics may be better indicators of which LLR mapping to use than other reliability characteristics. For example, in one embodiment, cells may be easily disturbed by reading nearby cells, and the reliability module 304 may give the read count a heavy weight when associating the cell with an LLR mapping. In another embodiment, however, cells may not be easily disturbed by reading nearby cells, and the reliability module 304 may not give the read count a heavy weight when associating the cell with an LLR.

In certain embodiments, the program/erase cycle count and the retention time for the set of cells may significantly affect the distribution of microstates for a set of cells, and the reliability module 304 may use reliability categories based on both the program/erase cycle count and the retention time for the set of cells. For example, in one embodiment, reliability categories may be defined by program/erase cycle counts of 1,000, 2,000, 3,000, etc., and by retention times of one month, two months, three months, etc. Different program/erase cycle counts and retention times could define the reliability categories in different embodiments. In another embodiment, however, program/erase cycle count and/or retention time may be less significant, and reliability categories may be based on another reliability characteristic or combination of reliability characteristics.

In one embodiment, retention time is the time since the last write or refresh of data for the set of cells. As used herein, refreshing data may comprise reading the data, correcting one or more errors in the data, and storing the corrected data. Data may be refreshed in a new location in the non-volatile memory media 122 (e.g., an append point of a sequential, log-based writing structure, a different erase block) or to the same location (e.g., for write-in-place media). For example, a grooming, garbage collection, or storage capacity recovery process may refresh data by detecting one or more errors, correcting one or more errors, copying or moving valid data from an erase block to a new location (e.g., an append point of a sequential, log-based writing structure), erasing the erase block as described above, or the like, thereby reclaiming a memory location for reuse for other storage operations. In a further embodiment, the reliability module 304 may measure the retention time by checking a timestamp for the set of cells. In certain embodiments, the retention time for a set of cells may be less than the time since the data stored by the set of cells was first written to the non-volatile memory device 120, because garbage collection or grooming processes may consolidate data from different sets of cells, refreshing the data as it is rewritten to a different location and a different set of storage cells, such as an append point of a sequential log-based writing structure, or the like.

The LLR map module 306, in one embodiment, is configured to determine an LLR value based on the soft read information from the soft read module 302, by using an LLR mapping. In certain embodiments, the LLR map module 306 may use the LLR mapping to translate or convert the soft read information to an LLR value, or otherwise assign an LLR value to the cell based on the soft read information, by using the LLR mapping. In various embodiments, a means for assigning an LLR value to the cell may include an LLR map module 306, an ECC module 150, a non-volatile memory controller 124, a non-volatile memory media controller 126, a device driver such as an SML 130, a processor 111, a read pipeline 241, other logic hardware and/or other executable code stored on a computer readable storage medium. Other embodiments may include similar or equivalent means for assigning an LLR value to the cell based on the soft read information.

In one embodiment, the LLR map module 306 may determine an LLR value based on soft read information obtained by the soft read module 302 for a cell. In various embodiments, an LLR value may be a log-likelihood ratio, which indicates a data value for the cell and a probability that the data value is correct. In general, a non-volatile memory medium 122 may act as a noisy channel, so that a data value written to the non-volatile memory medium 122 (sent via the noisy channel) may or may not be equal to the data value read from the non-volatile memory medium 122 (received via the noisy channel). In one embodiment, in response to the soft read module 302 reading or sensing soft information for a cell, a likelihood function may be associated with each data value that the cell could store. In a further embodiment, the likelihood function for a particular data value may correspond to the likelihood that that data value was written to the cell, given the observed soft read information. In certain embodiments, the likelihood that a particular bit value was written to a cell, based on the soft read information received for the cell, may equal the probability of receiving particular soft read information if that particular bit was written.

As an example of likelihood functions, in one embodiment, a cell may be an SLC flash cell with a lower and an upper state, where the lower state encodes a binary one, and a the upper state encodes a binary zero. In certain embodiments, the non-volatile memory media controller 126, the SML 130, the non-volatile memory controller 124, a storage client 116, or the like may invert the binary values stored by the cell, thus treating the binary value stored by the lower state as a logical zero, and the binary value stored by the upper state as a logical one, or may use a different logical encoding for the cell. In a further embodiment, a binary zero may be written to the cell by programming the cell into the upper state. However, the data-encoding physical property of the cell (e.g., a stored read voltage level determined based on a threshold voltage $V_t$ sufficient to make the floating gate transistor conduct when applied to the control gate) may move near or across the boundary between states. The soft read module 302 may use soft read thresholds at various voltage levels to determine soft read information for the cell. The likelihood that a binary zero was written is then the probability of receiving that soft read information if a binary zero was written, and the likelihood that a binary one was written is the probability of receiving that soft read information if a binary one was written.

For example, if soft read information indicates in which microstate a stored read voltage level for the cell is (e.g., the soft read information indicates that the stored read voltage level is within a particular range or microstate, between two soft read thresholds), then the likelihood that a binary zero was written is the probability of observing the cell in that microstate if a binary zero was written, and the likelihood that a binary one was written is the probability of observing the cell in that microstate if a binary one was written. As a further example, if the cell is in the lower state that encodes a binary one, then it is more likely that a binary one was written than that a binary zero was written, although it is still possible that a binary zero was written if the voltage for the cell moved across the boundary between states. The soft read information may clarify the respective likelihoods: if the soft read information indicates that the cell is in a microstate far from the boundary between states, then it may be more likely that a binary one was written than that a binary zero was written, but if the soft read information indicates that the cell is in a microstate near the boundary between states, then it may be only slightly more likely that a binary one was written than that a binary zero was written.

In certain embodiments, a comparison of likelihood functions may indicate which data value was probably written to the cell. For example, in one embodiment, the cell may be the SLC flash cell described above, and the likelihood that a binary zero was written may be divided by the likelihood that a binary one was written to obtain a likelihood ratio. If this likelihood ratio is greater than one, then the original data value is more likely to be a binary zero than a binary one. Conversely, if this likelihood ratio is less than one, then the original data value is more likely to be a binary one than a binary zero. Similarly, if the likelihood ratio is much greater than or much less than one, then the more likely data value is very likely correct, but if the likelihood ratio is close to one, then the more likely data value may still very possibly be in error.

In another embodiment, a likelihood ratio or ratios may indicate which data value was probably written to the cell for cells with more than two states, such as MLC or TLC flash cells, or the like. For example, in one embodiment, a cell may use more than two states to encode more than one bit of data, and one or more likelihood ratios may compare the likelihood of one multiple-bit data value to the likelihood of each of the other possible data values, or to the likelihood of all of the other data values combined. However, in a further embodiment, two data values corresponding to two adjacent states may be the most likely, and data values corresponding to other states may have likelihoods of practically zero, so that a single likelihood ratio comparing the likelihoods of the two most likely data values may be similar to the likelihood ratio described above for an SLC flash cell.

In some embodiments, a log-likelihood ratio (LLR) may be a logarithm of a likelihood ratio. In certain embodiments, the log-likelihood ratio may be scaled for convenience by choosing a base for the logarithm, or, equivalently, by using a convenient base for the logarithm and multiplying the result by a scaling factor. In further embodiments, it may be more convenient to work with an LLR value than with a likelihood ratio or individual likelihood functions themselves. Accordingly, in some embodiments, the LLR map module 306 may determine or assign an LLR value for the cell directly based on the soft read information, without determining a value for the likelihood ratio or individual likelihood functions, or calculating a logarithm. Because logarithms are monotonically increasing functions, the logarithm of a likelihood is high if the likelihood is high, and low if the likelihood is low. Also, as a property of logarithms, the logarithm of a likelihood ratio is equal to the difference between the logarithms of the two likelihood functions used to calculate the ratio. Thus, the sign of an LLR value indicates a data value for the cell, and the magnitude of the LLR value indicates the probability that the data value is correct.

In one embodiment, an LLR value may be a scaled or otherwise transformed log-likelihood ratio. In certain embodiments, a scaled or transformed log-likelihood ratio may be convenient for storage or for use by a soft-decision ECC decoder. For example, in one embodiment, a log-likelihood ratio may be a non-integer number, but may be truncated, rounded, or otherwise transformed to an integer LLR value. In a further embodiment, a log-likelihood ratio may be scaled based on the number of bits the ECC module 150 uses for the LLR value. For example, in one embodiment, a soft-decision ECC decoder may use four-bit LLR values (each LLR value is encoded using four bits), comprising a sign bit and three magnitude bits, and the log-likelihood ratio may be scaled and truncated to a range of integers from −7 to 7. Alternatively, in another embodiment, a soft-decision ECC decoder may use unsigned LLR values, and the log-likelihood ratio may be shifted to a range from 0 to 15; however, the LLR value still indicates a data value for the cell, and the probability that the data value is correct. In various embodiments, the LLR value may be a log-likelihood ratio which may be transformed in various ways, which are clear in light of this disclosure.

In one embodiment, the LLR map module 306 may translate or convert the soft read information from the soft read module 302 to an LLR value using an LLR mapping. In certain embodiments, an LLR mapping may refer to any function which takes soft read information as an input, and returns an LLR value as an output. For example, in one embodiment, an LLR mapping may be a function which mathematically calculates an LLR value based on the soft read information, and the LLR map module 306 may implement the LLR mapping using general purpose computing hardware such as a processor 111, or using specific purpose hardware, such as a combination of shift registers, adders, and the like.

In another embodiment, an LLR mapping may be a table the LLR map module 306 uses to look up LLR values based on soft read information. In further embodiments, where the LLR mapping is a table, the form of the table may vary depending on the form of the LLR values and the form of the soft read information. For example, in one embodiment, the LLR value may be a value represented by four bits and have a range from −7 to 7, as described above, and the soft read information may be a five-bit value where each bit indicates whether the cell satisfies one of five soft read thresholds. In such an embodiment, the LLR mapping may map the 32 possible five-bit values of soft read information to the 15 possible LLR values. In another embodiment, with a four-bit LLR value as described above, five read thresholds may define boundaries between six microstates for the cell, and the soft read information may indicate which of the six microstates the cell is in. In such an embodiment, the LLR mapping may map the six microstates that the soft read information may indicate to six of the fifteen possible LLR values. The remaining nine possible LLR values may be omitted from the mapping due to the limited range of soft read information. Many different types of tables, functions, or other mappings from soft read information to LLR values will be clear in light of this disclosure. LLR mappings are described further below with regard to FIG. 6.

In one embodiment, as described above with regard to the reliability module 304, the LLR mapping may be associated with a cell based on reliability characteristics, or a reliability category, for the set of cells that the cell is in. The LLR map module 306 may use different LLR mappings for cells with different reliability characteristics to compensate for the effects of the various reliability characteristics on the likelihood of correctly reading a stored data value. In certain embodiments, the LLR map module 306 may select an LLR mapping from a plurality of predefined LLR mappings based on one or more of the reliability characteristics determined by the reliability module 304 for the cell. In one embodiment, the LLR map module 306 may dynamically select or change the LLR mapping.

For example, in one embodiment, the LLR map module 306 may store multiple LLR tables for different reliability categories in a designated storage region for the non-volatile memory device 120, or on the computer readable storage medium 114, and may load one of the LLR tables into memory of a driver or controller for converting soft read information to LLR values. In another embodiment, the LLR map module 306 may change individual values of a previously loaded LLR table, or adjust the parameters of a function that determines LLR values. In certain embodiments, selecting an LLR mapping may include selecting values for the read thresholds upon which the soft information for the LLR mapping is based. For example, the soft read module 302 may use different read thresholds, such as read voltage thresholds, read resistance thresholds, or the like to determine soft read information for cells with different reliability characteristics, depending on which LLR mapping the LLR map module 306 selects for the cells. Measuring the performance of cells in a reliability category, and dynamically changing or selecting an LLR mapping accordingly, may provide higher error correction performance than selecting an LLR mapping based on theoretical or hypothesized performance, or using a single, static LLR mapping.

In one embodiment, the LLR map module 306 may use an LLR mapping for a set of cells that is based on a measured performance or a measured characterization of cells in the same reliability category as the set of cells, or having similar reliability characteristics. In one embodiment, the ECC module 150 may measure the performance of a set of cells for the non-volatile memory device 120. For example, in certain embodiments, a set of cells in a particular reliability category may be marked as invalid and erased by a garbage collector or groomer at runtime, and the ECC module 150 may characterize, or measure the performance of that set of cells. In another embodiment, however, the LLR map module 306 may use a predetermined LLR mapping based on a previous measurement or characterization of cells from another non-volatile memory device.

In general, in some embodiments, the performance or characterization of cells may be measured by writing ECC code words to the cells, using an ECC decoder to decode the code words, and measuring the bit error rate of the decoded code words. In certain embodiments, a measured performance or characterization of cells may be based on actual or simulated measurements, or a combination of actual and simulated measurements. For example, in one embodiment, an ECC module 150 may make an actual measurement for cells in a reliability category defined by the cells' age by repeatedly writing code words to the cells, reading and decoding the code words, and measuring the uncorrectable bit error rate of the code words. In another embodiment, however, an ECC module 150 may make an actual measurement of the distribution of microstates for cells in a reliability category defined by the cells' program/erase cycle count by sensing whether the cells satisfy several different read thresholds. However, actually measuring the cells' performance would change the cells' program/erase cycle count, possibly changing the reliability category for the cells. So, an ECC module 150 may use the distribution of microstates to make simulated measurements by sending and receiving code words over a simulated channel.

In some embodiments, an ECC module 150 may practically make actual measurements of cells' performance. In certain embodiments, however, simulated measurements may be more practical than actual measurements. For example, in one embodiment, a simulated channel may process code words faster than they could be written to, and read from non-volatile memory media 122. In another embodiment, a simulated channel may allow an ECC module 150 to measure the performance of cells in a reliability category based on a long retention time much more quickly than it could by writing code words to cells and waiting the retention time to read and decode the code words. Determining an LLR mapping based on a measured performance of cells in a reliability category is described in further detail below, for certain embodiments, with regard to the characterization module 406, channel model module 408, and LLR map determination module 410 of FIG. 4.

Figure 4:
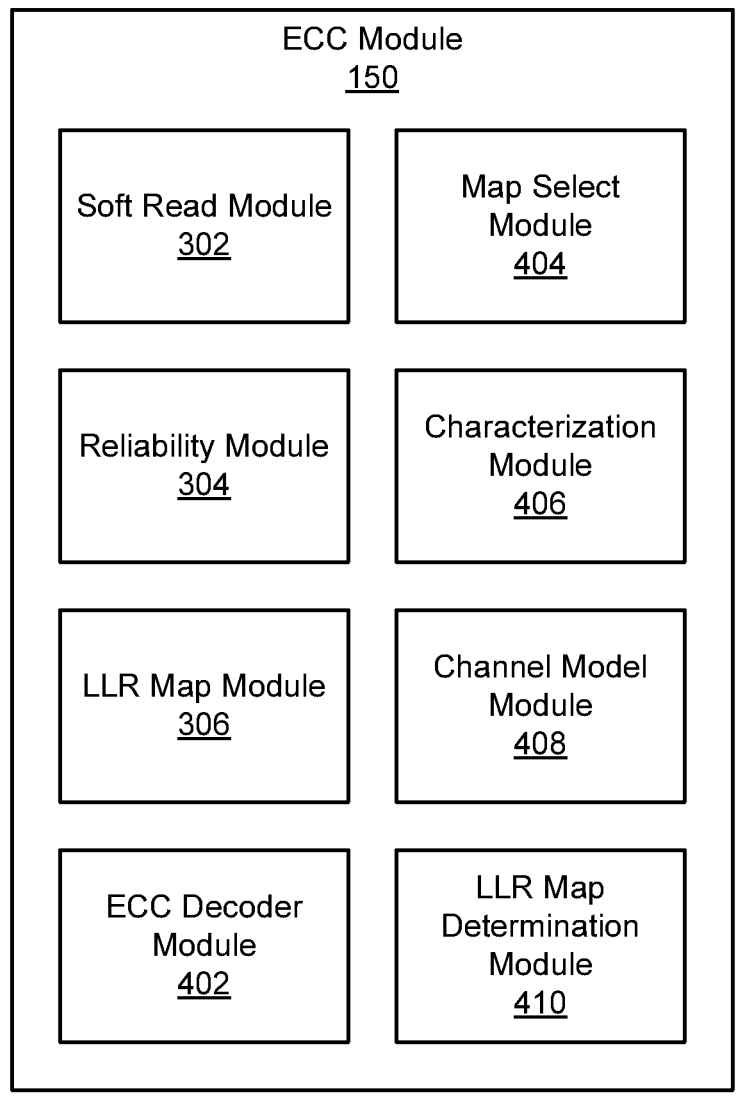
FIG. 4 is a schematic block diagram illustrating another embodiment of an ECC module.

FIG. 4 depicts another embodiment of an ECC module 150. The ECC module 150, in certain embodiments, may be substantially similar to the ECC module 150 described above with regard to FIG. 1A, FIG. 1B, FIG. 2, and/or FIG. 3. In the depicted embodiment, the ECC module 150 includes a soft read module 302, a reliability module 304, and an LLR map module 306, which may be configured substantially as described above with regard to FIG. 3. The ECC module 150, in the depicted embodiment, includes an ECC decoder module 402, a map select module 404, a characterization module 406, a channel model module 408, and an LLR map determination module 410. The depicted embodiment is intended as illustrative and not limiting; non-depicted embodiments may include fewer modules than depicted or may include additional modules not described herein.

The ECC decoder module 402, in one embodiment, is configured to decode data stored by a set of cells based on LLR values for the set of cells. In various embodiments, a means for decoding data based on LLR values may include an ECC decoder module 402, an ECC module 150, a non-volatile memory controller 124, a non-volatile memory media controller 126, a device driver such as an SML 130, a processor 111, a read pipeline 241, other logic hardware and/or other executable code stored on a computer readable storage medium. Other embodiments may include similar or equivalent means for decoding data based on LLR values.

In one embodiment, the ECC decoder module 402 may comprise a soft-decision ECC decoder, which operates on LLR inputs. In a further embodiment, the type of soft-decision ECC decoder may depend on the type of error correcting code the ECC module 150 uses; soft-decision decoders are available for many different error correcting codes. In one embodiment, the ECC decoder module 402 may use a soft-decision ECC decoder implemented in software, such as in a driver or SML 130. In another embodiment, the ECC decoder module 402 may use a soft-decision ECC decoder implemented in hardware, such as in a field-programmable gate array (FPGA) or application-specific integrated circuit (ASIC) for a non-volatile memory media controller 126. In certain embodiments, the ECC decoder module 402 may use a soft-decision ECC decoder implemented using a combination of hardware and software elements.

In certain embodiments, the ECC decoder module 402 may cooperate with the soft read module 302, reliability module 304, and LLR map module 306 to decode data based on LLR values. For example, in one embodiment, original data may form a message that is encoded using the error correcting code to form a code word. In a further embodiment, the data values forming the code word may be stored by cells in a set of cells. In certain embodiments, the soft read module 302 may determine soft read information for each cell in the set of cells. In a further embodiment, the reliability module 304 may determine a reliability category for the set of cells. In some embodiments, the LLR map module 306 may translate the soft read information to an LLR value by using an LLR mapping that is based on a measured performance of cells in the reliability category. In further embodiments, the ECC decoder module 402 may use the LLR values obtained from the LLR map module 306 as inputs to a soft-decision ECC decoder to decode the code word and recover the original message.

The map select module 404, in one embodiment, is configured to select a different LLR mapping for the LLR map module 306 to use for a set of cells, in response to a change in the reliability category or reliability characteristics for a set of cells. In one embodiment, the LLR map module 306 may be configured to use one LLR mapping to translate soft read information to LLR values for a set of cells, and the map select module 404 may select a different mapping, and reconfigure the LLR map module 306 to use the new LLR mapping, if the reliability category changes for the set of cells.

In certain embodiments, the map select module 404 may select an LLR mapping from a plurality of predetermined or predefined LLR mappings based on one or more of the reliability characteristics determined by the reliability module 304 for the cell. In a further embodiment, the LLR map module 306 may use the LLR mapping selected by the map select module 404 for the set of cells. In various embodiments, a means for selecting an LLR mapping may include a map select module 404, an LLR map module 306, an ECC module 150, a non-volatile memory controller 124, a non-volatile memory media controller 126, a device driver such as an SML 130, a processor 111, a read pipeline 241, other logic hardware and/or other executable code stored on a computer readable storage medium. Other embodiments may include similar or equivalent means for selecting an LLR mapping.

In one embodiment, the map select module 404 may cooperate with the reliability module 304 to sense changes in the reliability category or in one or more reliability characteristics for various sets of cells. In one embodiment, the map select module 404 may periodically iterate through the sets of cells and use the reliability module 304 to determine their reliability category or characteristics. In another embodiment, the reliability module 304 may continually track a reliability characteristic such as the age or temperature of the device, and record significant changes. In yet another embodiment, the reliability module 304 may sense a reliability category or characteristic in response to the non-volatile memory device 120 receiving a read request for the set of cells, and sense whether the reliability category or characteristic has changed in response to the non-volatile memory device 120 receiving a second read request for the set of cells. In certain embodiments, the map select module 404 may record a reliability characteristic from the reliability module 304 in a reserved area for the set of cells, and may detect a change by comparing a current reliability characteristic to the recorded reliability characteristic.

In certain embodiments, the map select module 404 may associate an LLR mapping with each set of cells, based on a reliability category. For example, in one embodiment, the map select module 404 may store an indication of which LLR mapping to use in a reserved area for each set of cells. In a further embodiment, if a change occurs in a reliability category, the map select module 404 may then update the indication of which LLR mapping to use for the set of cells. In certain embodiments, the LLR map module 306 may check the indication of which LLR mapping to use, then use the indicated LLR mapping to convert soft read information to LLR values for the set of cells. Associating an LLR mapping with each set of cells allows the LLR map module 306 to produce accurate LLR values for different sets of cells in different reliability categories.

In one embodiment, in response to sensing or detecting a change in one or more reliability characteristics or in the reliability category for the set of cells, the map select module 404 may select a new LLR mapping associated with the new reliability characteristic or category, for the LLR map module 306 to use. In one embodiment, the map select module 404 may select the LLR mapping from a plurality of available LLR mappings. In another embodiment, the map select module 404 may update an existing LLR mapping with different parameters or values based on the changed reliability category.

The characterization module 406, in one embodiment, is configured to determine a distribution of microstates for cells having similar reliability characteristics (e.g., cells in the same reliability category). As described below with regard to FIG. 5B, in certain embodiments, a plurality of soft read thresholds may define a plurality of microstates for the cells. In further embodiments, the characterization module 406 may determine a distribution of microstates by sensing whether each of the cells satisfies the various read thresholds.

In one embodiment, a distribution of microstates for a set of cells may be based on a count of cells in each microstate. The distribution of microstates may indicate a direct or scaled count of cells in each microstate. Thus, in a further embodiment, the characterization module 406 may determine a distribution of microstates in the form of a histogram indicating the number of cells in each microstate. In another embodiment, the characterization module 406 may determine a distribution of microstates in the form of a discrete probability distribution that indicates the number of cells in each microstate divided by the number of cells in the set, so that the probability distribution sums to one.

In certain embodiments, the characterization module 406 may determine multiple distributions of microstates for cells in different reliability categories. For example, in one embodiment, the characterization module 406 may determine a distribution of microstates for a new non-volatile memory device 120, then may wear out the non-volatile memory device 120 (e.g., by repeatedly writing and erasing data) to change the reliability category of a non-volatile memory medium 122, and determine a different distribution of microstates for the cells in the new reliability category. In further embodiments, the different distributions may be used to determine different LLR mappings for cells in different reliability categories, as described below.

The channel model module 408, in one embodiment, is configured to simulate a noisy channel. In various embodiments a noisy channel may transform "sent" data (e.g., data written to a non-volatile memory device 120) to "received" data (e.g., data read from a non-volatile memory device 120), and may introduce errors in the received data. In certain embodiments, a noisy channel may transform data values written to a non-volatile memory medium to soft read information that a soft read module 302 may obtain. For example, non-volatile memory media 122 may be an actual noisy channel that receives data values that are sent or written to it, and that allows a soft read module 302 to sense soft read information for its cells. As another example, in one embodiment, the channel model module 408 may simulate a noisy channel by transforming data values to soft read information without actually writing the data values to the cells.

In some embodiments, by simulating a noisy channel, the channel model module 408 may provide measurements of cells' performance faster than using the cells themselves as an actual channel. In certain embodiments, the channel model module 408 may simulate a noisy channel by transforming data values to soft read information based on a distribution of microstates received from the characterization module 406. For example, in one embodiment, the channel model module 408 may obtain a discrete cumulative density function (CDF) by summing probabilities from the distribution of microstates, and may use inverse transform sampling to transform data values to soft read information based on the CDF. In certain embodiments, the channel model module 408 may simulate multiple noisy channels based on distributions of microstates for multiple sets of cells in different reliability categories. Simulating the performance of sets of cells in different reliability categories, in further embodiments, may allow the LLR map determination module 410 to determine LLR mappings.

The LLR map determination module 410, in one embodiment, is configured to determine an LLR mapping based on a measured characterization or performance of cells having similar reliability characteristics (e.g., cells in the same reliability category). In one embodiment, the LLR map determination module 410 may engage the channel model module 408, and use the simulated noisy channel to transform data values to soft read information for a plurality of code words of an error correcting code. For example, in certain embodiments, the LLR map determination module 410 may simulate a large number or write operations by transforming millions of code words from data values to soft read information.

In a further embodiment, the LLR map determination module 410 may engage the LLR map module 306 to translate the soft read information to LLR values using a plurality of LLR mappings. Thus, the LLR map determination module 410 may use soft read information from the plurality of code words to test various LLR mappings. In one embodiment, the LLR map determination module 410 may generate a plurality of LLR mappings according to predicted distributions of microstates for cells in a reliability category. In another embodiment, the LLR map determination module 410 may generate a plurality of LLR mappings at random.

In one embodiment, the LLR map determination module 410 may activate a soft-decision ECC decoder for the error-correcting code to decode the plurality of code words based on the LLR values from the plurality of LLR mappings. The different LLR mappings may provide better or worse LLR values, affecting the soft-decision ECC decoder's ability to correctly decode the plurality of code words. Thus, in a further embodiment, the LLR map determination module 410 may select an LLR mapping for cells in the reliability category based on a bit error rate for the decoded code words. For example, in one embodiment, the LLR map determination module 410 may select the LLR mapping that results in the lowest uncorrectable bit error rate for the decoded code words. In certain embodiments, the LLR map determination module 410 may repeat these steps for different reliability categories, to select or determine an LLR mapping based on measuring cells' performance in each reliability category. In some embodiments, the LLR map determination module 410 may save the selected LLR mapping for the different reliability categories to a location accessible by the ECC module 150, and the map select module 404 may dynamically select which LLR mapping to use with a set of cells at runtime.

In the depicted embodiment, the characterization module 406, channel model module 408, and LLR map determination module 410 cooperate to determine LLR mappings at or before runtime, as part of an ECC module 150 within a non-volatile memory controller 124. In another embodiment, however, the characterization module 406, channel model module 408, and LLR map determination module 410 may cooperate to determine LLR mappings as part of a separate system, so that predetermined LLR mappings can be loaded onto multiple non-volatile memory devices 120.

Figure 5A:
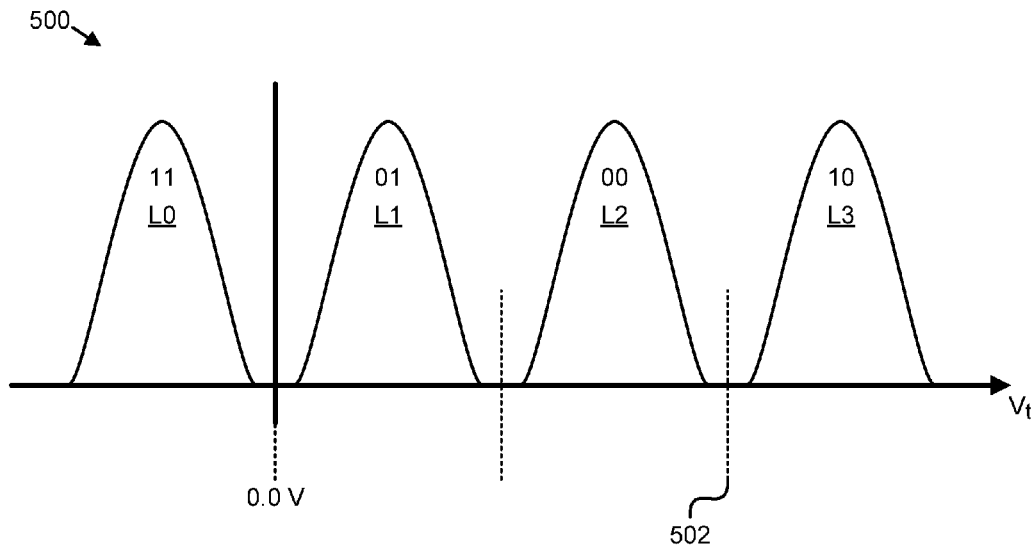
FIG. 5A is a graph illustrating one embodiment of a distribution of stored read voltage values for cells of a non-volatile memory medium.

FIG. 5A depicts a graph 500 of a distribution of stored read voltage values for cells of a non-volatile memory medium 122. In the depicted embodiment, the non-volatile memory medium 122 is an MLC flash memory medium in which each cell has four states, but various types of memory and numbers of states per cell may be used in other embodiments. In the depicted embodiment, the data-encoding physical value of each cell is the stored read voltage of the cell. Data is stored in each cell by changing the amount of stored charge in the floating gate, which determines the stored read voltage for the cell and within which abode or state (e.g., the depicted L0, L1, L2, and L3 abodes) the stored read voltage falls.

In the depicted embodiment, hard read thresholds 502 (e.g., $V_t$) divide the range of possible stored read voltage values for a cell into states L0, L1, L2, and L3, where L0 is the erased state. A read threshold voltage 502 (e.g., $V_t$) is applied to the control gate of the cell, and if the applied read threshold voltage 502 is sufficient to make the channel of the floating gate transistor conductive, the stored read voltage for the cell is above the applied read threshold voltage 502. If the stored read voltage for a cell is below the first hard read threshold 502, the cell is in the L0 state. If the stored read voltage for a cell is above the first hard read threshold 502 but below the second hard read threshold 502, the cell is in the L1 state, and so on. In some embodiments, the erased state L0 may correspond to a negative stored read voltage.

In one embodiment, an encoding maps states onto data values. For example, in the depicted embodiment, a Gray code encoding maps the four states L0, L1, L2, and L3 to the data values "11," "01," "00," and "10," respectively, so that the cell stores two bits of information. Cells of non-volatile memory media may store data using many other encodings.

The graph 500 depicts the distribution of stored read voltage values for a set of cells, representing the number of cells storing each possible stored read voltage value occurring for the set of cells, a random selection from the set of cells, or the like. The graph 500 depicts a uniform distribution among states L0-L3. In practice, the distribution of states for a set of cells may not be uniform. For example, if a long string of zeroes is written to a set of cells, more cells may be in the L2 state, which encodes "00" than in the other states. However, data compression or whitening algorithms may make the distribution of states substantially uniform over a large set of cells.

Although the distribution may be substantially uniform among states L0-L3, it is depicted as forming a bell-shaped peak in each state. In some embodiments, a cell may be programmed by issuing voltage pulses that move a stored read voltage level for the cell to or near a target voltage in the middle of the range of voltages that defines the state. Thus, a bell-shaped peak may be centered on the target programming voltage, or the like. The width of the peaks may be affected by variations in the cells and the programming process, or by error-causing phenomena such as read disturbs, program disturbs, stress-induced leakage current, or the like. Although symmetric, bell-shaped peaks are shown, skewed distributions and other distributions are possible. Over time, the distributions may widen or skew as the stored read voltage of cells move from their originally programmed values. In the depicted embodiment, the peaks do not significantly overlap the boundaries between states, indicating that cells are not likely to move into adjacent states. Therefore, hard read thresholds 502 may be sufficient to determine what data value was originally written to a cell, based on the cell's current state.

Figure 5B:
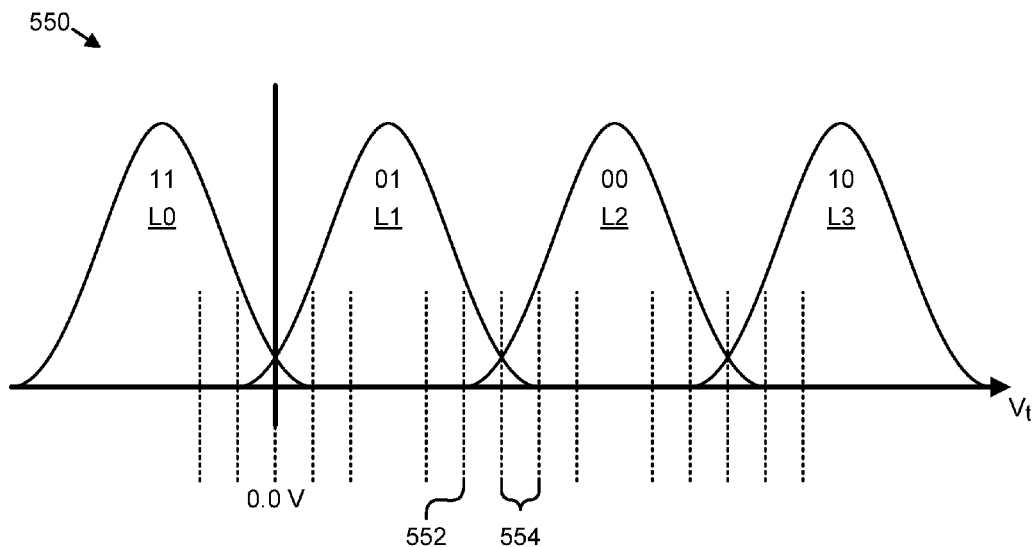
FIG. 5B is a graph illustrating another embodiment of a distribution of stored read voltage values for cells of a non-volatile memory medium.

FIG. 5B depicts a graph 550 of another distribution of stored read voltage values for the same set of cells as FIG. 5A. The same boundaries define states L0, L1, L2, and L3, encoding data values "11," "01," 00," and "10," respectively, as described above. However, the peaks are wider in FIG. 5B than in FIG. 5A, and significantly overlap each other. Because the peaks overlap, there is a substantial likelihood that a cell programmed into one state may move into an adjacent state. (The distribution is depicted as a set of overlapping peaks to emphasize the possibility that a cell may move into an adjacent state; an actual distribution may be the sum of the individual peaks).

In FIG. 5B, the peaks have widened, and the reliability category of the peaks may have changed due to an increased program/erase cycle count, increased retention time, or other characteristics of the set of cells that may cause the stored read voltage values to move. Accordingly, hard read thresholds 502 alone may be insufficient to determine what data value was originally written to a cell, based on the cell's current state. Therefore, in the depicted embodiment, soft read thresholds 552 divide the range of possible stored read voltage values into microstates 554 that are smaller than the states L0-L3. The soft read thresholds 552 include five read thresholds at or near each of the three boundaries between states, so fifteen soft read thresholds 552 are depicted. Although five soft read thresholds 552 are depicted with uniform spacing at each of the boundaries between states, other different numbers of soft read thresholds 552 and spacing for soft read thresholds 552 may be used in other embodiments, depending on the desired soft read information, such as two soft read thresholds 552, three soft read thresholds 552, four soft read thresholds 552, ten soft read thresholds 552, or another predetermined number of soft read thresholds 552.

Microstates 554 defined between the soft read thresholds 552 have a finer granularity than the states or abodes, because of the increased number of soft read thresholds 552. The width of various microstates 554, however, may vary as shown by the graph 550 due to varying distances between soft read thresholds. For example, in the depicted embodiment, the soft read thresholds 552 are closely spaced near boundaries between states, but widely spaced elsewhere, so microstates 554 may be smaller near the edges of peaks, but larger near the peaks' centers. This spacing of microstates 554 may be useful, in some embodiments, because likelihoods of error may vary significantly between microstates 554 at or near an overlap between peaks, but may be small for any microstates 554 near a peak's center.

FIG. 6 depicts a set of tables illustrating a first LLR mapping 610 and a second LLR mapping 620. In the depicted embodiment, each LLR mapping 610, 620 translates six microstates, which may be indicated by the soft read information for a cell with five soft read thresholds, to a four-bit LLR value in a range from −7 to 7. However, the depicted embodiment is to be interpreted as illustrative and not limiting; in another embodiment, an LLR mapping may use a different type of soft read information or a different range of possible LLR values, or may map soft read information to LLR values in a different way.

In one embodiment, five read thresholds may define boundaries between six microstates for the cell, and the soft read information may indicate which of the six microstates the cell is in. For example, in the depicted embodiment, the six microstates are defined by the five soft read thresholds 552 near the boundary of states L1 and L2 of FIG. 5B. In a further embodiment, the microstates may be numbered, for convenience, based on how many soft read thresholds are satisfied in each microstate. Thus, in the depicted embodiment, microstate 0 is the lowest microstate, which satisfies none of the soft read thresholds, microstate 1 is the next microstate above microstate 0, and which satisfies the first read threshold, microstate 2 is the next microstate above microstate 1, and satisfies the first two read thresholds, and so on.

In one embodiment, the LLR value may be represented by four bits and have a range from −7 to 7, as described above, so that the sign of the LLR value indicates a data value for the cell, and the magnitude of the LLR value indicates the probability that the data value is correct. In the depicted embodiment, there are fifteen possible LLR values from −7 to 7, but only six microstates, so each LLR mapping 610, 620 may omit certain LLR values, due to the limited range of soft read information.

In one embodiment, states L0, L1, L2, and L3 encode data values "11," "01," 00," and "10," respectively, as described above. Thus, in the depicted embodiment, the second stored bit is a binary one in states L0 and L1, and a binary zero in states L2 and L3, so soft read information based on the five soft read thresholds near the boundary of states L1 and L2 may be mapped to LLR values that indicate the likelihood that the second stored bit is a binary one or a binary zero.

Accordingly, in the depicted embodiment, both LLR mappings 610, 620 assign negative LLR values to the microstates 0 through 2, indicating that the second stored bit is more likely a binary one below the boundary of states L1 and L2, and both LLR mappings 610, 620 assign positive LLR values to microstates 3 through 5, indicating that the second stored bit is more likely a binary zero above the boundary of states L1 and L2. Furthermore, in both LLR mappings 610, 620, the magnitude of the LLR value increases with the distance of the microstate from the boundary between states L1 and L2, indicating increasing confidence that the second stored bit is correct for microstates further from the boundary between states.

In one embodiment, the reliability module 304 may associate a cell with the first LLR mapping 610 based on a reliability characteristic such as a low program/erase cycle count, short retention time, or the like, (e.g., failing to satisfy a reliability threshold) which indicates that the read voltage value stored by the cell has not likely moved far from the voltage used for programming the cell. Therefore, even near the boundary between states L1 and L2, the value stored by the cell is moderately likely to be correct, so the magnitude of the LLR value is 3 in microstates 2 and 3.

In another embodiment, the reliability module 304 may associate a cell with the second LLR mapping 620 based on a reliability characteristic such as a high program/erase cycle count, long retention time, or the like, (e.g., satisfying a reliability threshold) which indicates that the read voltage value stored by the cell may have moved far from the voltage used for programming the cell. Therefore, near the boundary between states L1 and L2, the value stored by the cell may not be very likely to be correct, so the magnitude of the LLR value is binary one in microstates 2 and 3. Because the same soft read information may indicate different likelihoods that a data value is correct for cells with different reliability characteristics, using different LLR mappings 610, 620 for cells with different reliability characteristics, in certain embodiments, allows the LLR map module 306 to provide accurate probabilistic information to a soft-decision ECC decoder, such as ECC decoder module 402.

In the depicted embodiment, both LLR mappings 610, 620 map the same microstates to different LLR values. However, in another embodiment, selecting an LLR mapping may include selecting values for the read thresholds that define microstates, and different LLR mappings 610, 620 may be based on different read thresholds. In a further embodiment, a single, combined table or other data structure may include multiple LLR mappings 610, 620, and may be indexed or otherwise accessible by both soft read information (e.g., microstate) and by one or more reliability characteristics, so that a single table or data structure may include different LLR mappings 610, 620 based on different reliability characteristics.

Figure 7:
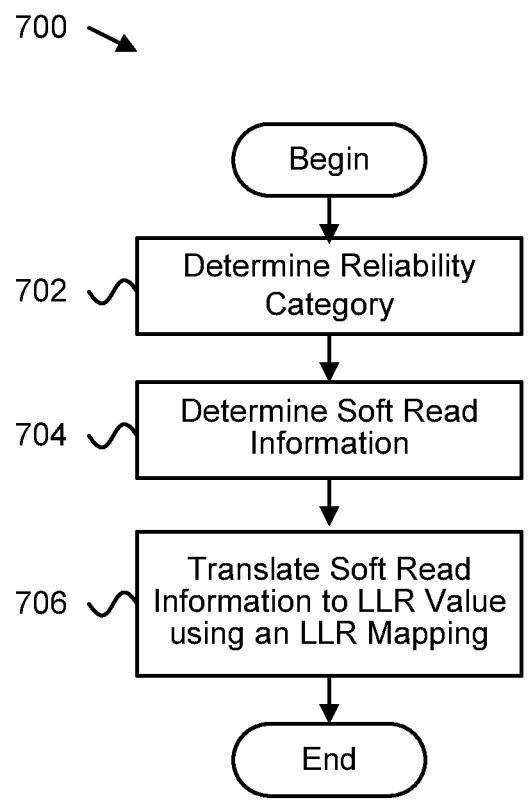
FIG. 7 is a schematic flow chart diagram illustrating one embodiment of a method for ECC decoding.

FIG. 7 depicts one embodiment of a method 700 for ECC decoding. The method 700 begins, and the reliability module 304 determines 702 a reliability category for a set of cells of a non-volatile memory medium 122. The soft read module 302 determines 704 soft read information for one or more cells of the set of cells. The LLR map module 306 translates 706 the soft read information to an LLR value for use by a soft-decision ECC decoder, by using an LLR mapping, and the method 700 ends. In one embodiment, the LLR mapping may be based on a measured performance of cells in the reliability category.

Figure 8:
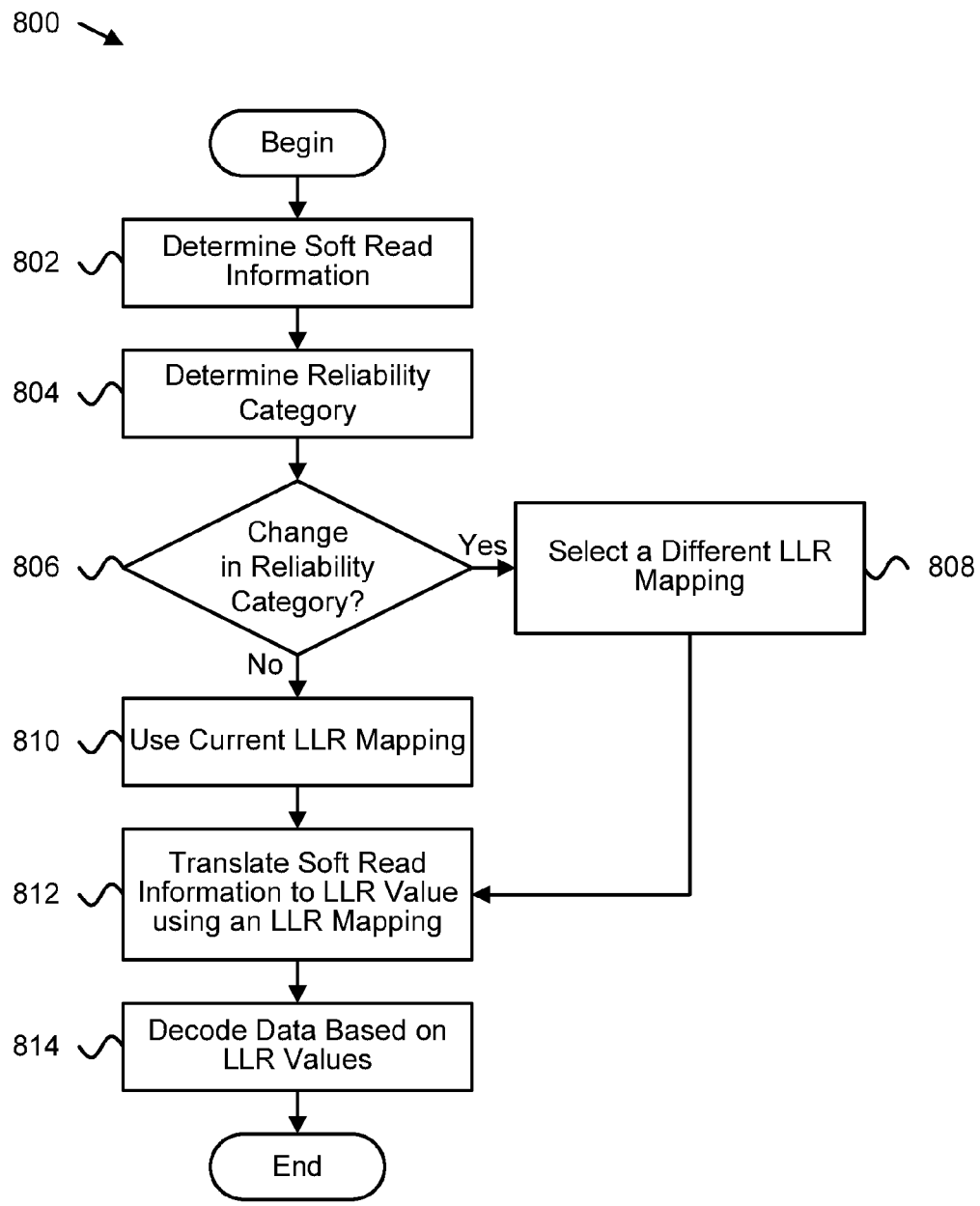
FIG. 8 is a schematic flow chart diagram illustrating another embodiment of a method for ECC decoding.

FIG. 8 depicts another embodiment of a method 800 for ECC decoding. The method 800 begins, and the soft read module 302 determines 802 soft read information for a cell of a non-volatile memory medium 122. The reliability module 304 determines 804 a reliability category for the set of cells that the cell is in. The map select module 404 determines 806 if a change in the reliability category has occurred. If a change has occurred, the map select module 404 selects 808 a different LLR mapping for the LLR map module 306. If a change has not occurred, the LLR map module 306 uses 810 its current LLR mapping for the set of cells. The LLR map module 306 translates 812 the soft read information to an LLR value by using the LLR mapping. In one embodiment, the LLR mapping may be based on a measured performance of cells in the reliability category. The ECC decoder module 402 decodes 814 data from the set of cells based on LLR values for the set of cells, and the method 800 ends.

Figure 9:
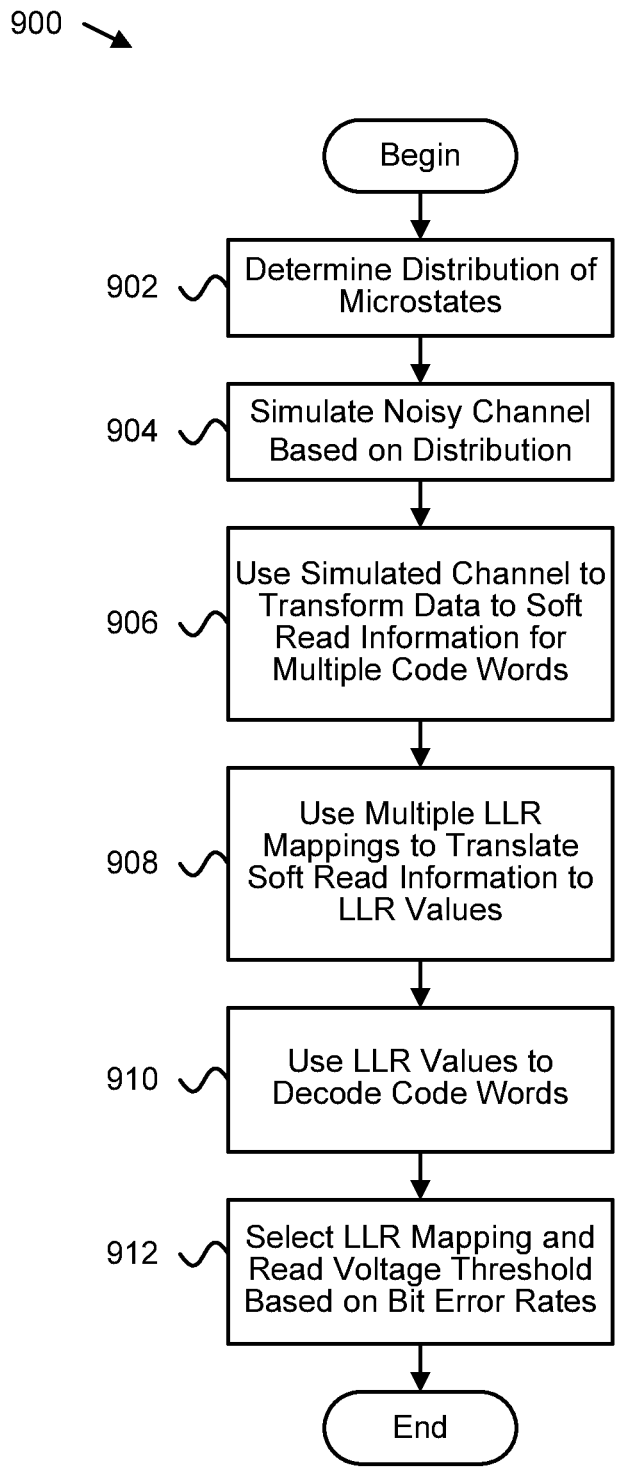
FIG. 9 is a schematic flow chart diagram illustrating one embodiment of a method for determining a log-likelihood ratio (LLR) mapping.

FIG. 9 depicts one embodiment of a method 900 for determining an LLR mapping. The method 900 begins, and the characterization module 406 determines 902 a distribution of microstates for cells in a reliability category. The channel model module 408 simulates 904 a noisy channel based on the distribution. The LLR map determination module 410 uses 906 the simulated channel to transform data to soft read information for multiple code words. The LLR map determination module 410 uses 908 multiple LLR mappings to translate the soft read information to LLR values, and uses 910 the LLR values to decode the code words. The LLR map determination module 410 selects 912 an LLR mapping and/or one or more read voltage thresholds for a set of cells storing the code words based on bit error rates for the decoded code words, and the method 900 ends.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. A method comprising:
   determining soft read information for a cell of a non-volatile storage medium;
   determining one or more reliability characteristics for the cell; and
   translating the soft read information to a log-likelihood ratio (LLR) value using an LLR mapping selected based on the one or more reliability characteristics, the LLR value indicating a probability that a data value for the cell is correct,
   wherein determining soft read information, determining one or more reliability characteristics, and translating the soft read information to an LLR value are performed by one or more of logic hardware and one or more processors executing computer usable program code.

2. The method of claim 1, wherein the soft read information indicates a probability that a data value for the cell is correct based on a plurality of soft read thresholds.

3. The method of claim 1, further comprising selecting a different LLR mapping for translating the soft read information to an LLR value, in response to determining a different reliability characteristic for the set of cells.

4. The method of claim 1, wherein the one or more reliability characteristics comprise one or more of a program/erase cycle count, a read count, a retention time, an age, an error rate, a write count and a temperature for the set of cells.

5. The method of claim 1, wherein the one or more reliability characteristics include a program/erase cycle count and a retention time for the set of cells.

6. The method of claim 1, further comprising determining a distribution of cells with similar reliability characteristics based on soft read information for each of the cells.

7. The method of claim 6, further comprising simulating a noisy channel that transforms data values to soft read information based on the distribution of cells.

8. The method of claim 7, further comprising determining an LLR mapping based on cells having similar reliability characteristics by:
   using the simulated noisy channel to transform data values to soft read information for a plurality of code words;
   using a plurality of LLR mappings to translate the soft read information to LLR values;
   decoding the plurality of code words based on the LLR values; and
   selecting the LLR mapping from the plurality of LLR mappings based on a bit error rate for the decoded code words.

9. An apparatus comprising:
   a soft read module configured to obtain soft read data for a cell of a non-volatile memory medium, the soft read data indicating a likelihood that a data value for the cell is correct;
   a reliability module configured to associate the cell with a log-likelihood ratio (LLR) mapping from a plurality of LLR mappings based on one or more reliability characteristics for a set of cells comprising the cell, the associated LLR mapping comprising a mapping from soft read data to LLR values; and
   an LLR map module configured to determine an LLR value based on the soft read data using the LLR mapping.

10. The apparatus of claim 9, further comprising a map select module configured to select the LLR mapping for the LLR map module to use for the set of cells from the plurality of LLR mappings based on the one or more reliability characteristics for the set of cells.

11. The apparatus of claim 10, wherein the map select module is configured to select a different LLR mapping from the plurality of LLR mappings for the LLR map module to use for the set of cells, in response to a change in the one or more reliability characteristics for the set of cells.

12. The apparatus of claim 9, wherein the soft read module is configured to adjust a hard read threshold for the set of cells based on the one or more reliability characteristics and to determine a plurality of soft read thresholds based on the adjusted hard read threshold.

13. The apparatus of claim 9, wherein the one or more reliability characteristics comprise one or more of a program/erase cycle count, a read count, a retention time, an age, a raw bit error rate, an uncorrectable bit error rate, a write count and a temperature for the set of cells.

14. The apparatus of claim 9, wherein the one or more reliability characteristics comprise a program/erase cycle count and a retention time for the set of cells.

15. The apparatus of claim 9, further comprising a characterization module configured to determine a distribution of cells having similar reliability characteristics to the set of cells based on soft read data for the cells.

16. The apparatus of claim 15, further comprising a channel model module configured to simulate a noisy channel that transforms data values to soft read data based on the distribution of cells.

17. The apparatus of claim 16, further comprising an LLR map determination module configured to determine an LLR mapping based on cells having similar reliability characteristics by:
using the simulated noisy channel to transform data values to soft read data for a plurality of code words;
using a plurality of LLR mappings to translate the soft read data to LLR values;
decoding the plurality of code words based on the LLR values; and
selecting the LLR mapping from the plurality of LLR mappings based on a bit error rate for the decoded code words.

18. An apparatus comprising:
a reliability module configured to determine one or more reliability characteristics for a cell of a non-volatile recording medium;
a map select module configured to select a log-likelihood ratio (LLR) mapping from a plurality of predefined LLR mappings based on the one or more reliability characteristics, the LLR mapping comprising a mapping from soft read information to LLR values; and
a soft read module configured to gather the soft read information.

19. The apparatus of claim 18, wherein the soft read information indicates whether the cell satisfies soft read thresholds selected based on the one or more reliability characteristics.

20. The apparatus of claim 18, further comprising an error correcting code (ECC) decoder module configured to decode data stored by the cell based on LLR values corresponding to the soft read information in the LLR mapping.

* * * * *